US012660162B2

(12) United States Patent
Chiu

(10) Patent No.: US 12,660,162 B2
(45) Date of Patent: *Jun. 16, 2026

(54) SEMICONDUCTOR DEVICE HAVING SEMICONDUCTOR CHANNEL LAYER AND METHOD OF MANUFACTURING THE SAME

(71) Applicant: NANYA TECHNOLOGY CORPORATION, New Taipei City (TW)

(72) Inventor: Hsih-Yang Chiu, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 416 days.

This patent is subject to a terminal disclaimer.

(21) Appl. No.: 18/369,966

(22) Filed: Sep. 19, 2023

(65) Prior Publication Data

US 2024/0107745 A1     Mar. 28, 2024

Related U.S. Application Data

(62) Division of application No. 17/953,522, filed on Sep. 27, 2022.

(51) Int. Cl.
*H10B 12/00*     (2023.01)
*H10W 90/00*     (2026.01)
*H10W 80/00*     (2026.01)

(52) U.S. Cl.
CPC ........... *H10B 12/315* (2023.02); *H10B 12/05* (2023.02); *H10B 12/482* (2023.02);
(Continued)

(58) Field of Classification Search
CPC ........... H01L 2224/08145; H01L 2224/80896; H01L 2225/06524; H01L 2225/06565;
(Continued)

(56) References Cited

U.S. PATENT DOCUMENTS 12,457,733 B2 * 10/2025 Lo ...................... H10B 12/0335
2017/0243651 A1 * 8/2017 Choi .................. G11C 16/0483
(Continued)

FOREIGN PATENT DOCUMENTS

| CN | 111696977 B | 12/2023 |
| TW | 233377 B | 11/1994 |
| TW | 375795 B | 12/1999 |
| TW | 201220475 A | 5/2012 |
| TW | 202230734 A | 8/2022 |

OTHER PUBLICATIONS

Office Action and Search Report mailed on Feb. 16, 2024 related to Taiwanese Application No. 112111545.
(Continued)

*Primary Examiner* — Telly D Green
(74) *Attorney, Agent, or Firm* — Xuan Zhang

(57)     ABSTRACT

A semiconductor device and method for manufacturing the same are provided. The semiconductor device includes a substrate, a bit line, a semiconductor layer, and a word line. The bit line is disposed over the substrate. The semiconductor layer is disposed over the bit line. The word line abuts the semiconductor layer. The word line has a lower surface facing the substrate and an upper surface opposite to the lower surface. The semiconductor layer includes a first doped region with a first conductive type, a second doped region with a second conductive type opposite to the first conductive type. The first doped region is disposed between the second doped region and the bit line. The first boundary between the first doped region and the second doped region is substantially aligned with the lower surface of the word line.

4 Claims, 21 Drawing Sheets

100

(52) U.S. Cl.
CPC .......... _H10W 90/00_ (2026.01); _H10W 80/327_
(2026.01); _H10W 90/792_ (2026.01)

(58) Field of Classification Search
CPC ..... H01L 24/08; H01L 24/80; H01L 25/0657;
H01L 25/18; H01L 25/50; H01L
2924/1431; H01L 2924/1436; H10B
12/05; H10B 12/315; H10B 12/482;
H10W 72/90; H10W 80/327; H10W
90/00; H10W 90/20; H10W 90/26; H10W
90/792; H10W 99/00
See application file for complete search history.

(56) References Cited

U.S. PATENT DOCUMENTS

| | | | |
|---|---|---|---|
| 2023/0009047 A1* | 1/2023 | Xiao ................... | H10D 30/6728 |
| 2023/0200048 A1* | 6/2023 | Servalli .................. | H10B 12/05 |
| | | | 257/280 |
| 2024/0074145 A1* | 2/2024 | Lo ...................... | H10B 12/0335 |
| 2024/0107744 A1* | 3/2024 | Chiu ................... | H10B 12/315 |

OTHER PUBLICATIONS

Office Action and Search Report mailed on Jul. 3, 2024 related to
Taiwanese Application No. 112147489.
Office Action and and the search report mailed on Jul. 21, 2025
related to U.S. Appl. No. 17/953,522, wherein this application is a
DIV of U.S. Appl. No. 17/953,522.
English abstract of the foreign patent document of CN111696977B.

* cited by examiner

100

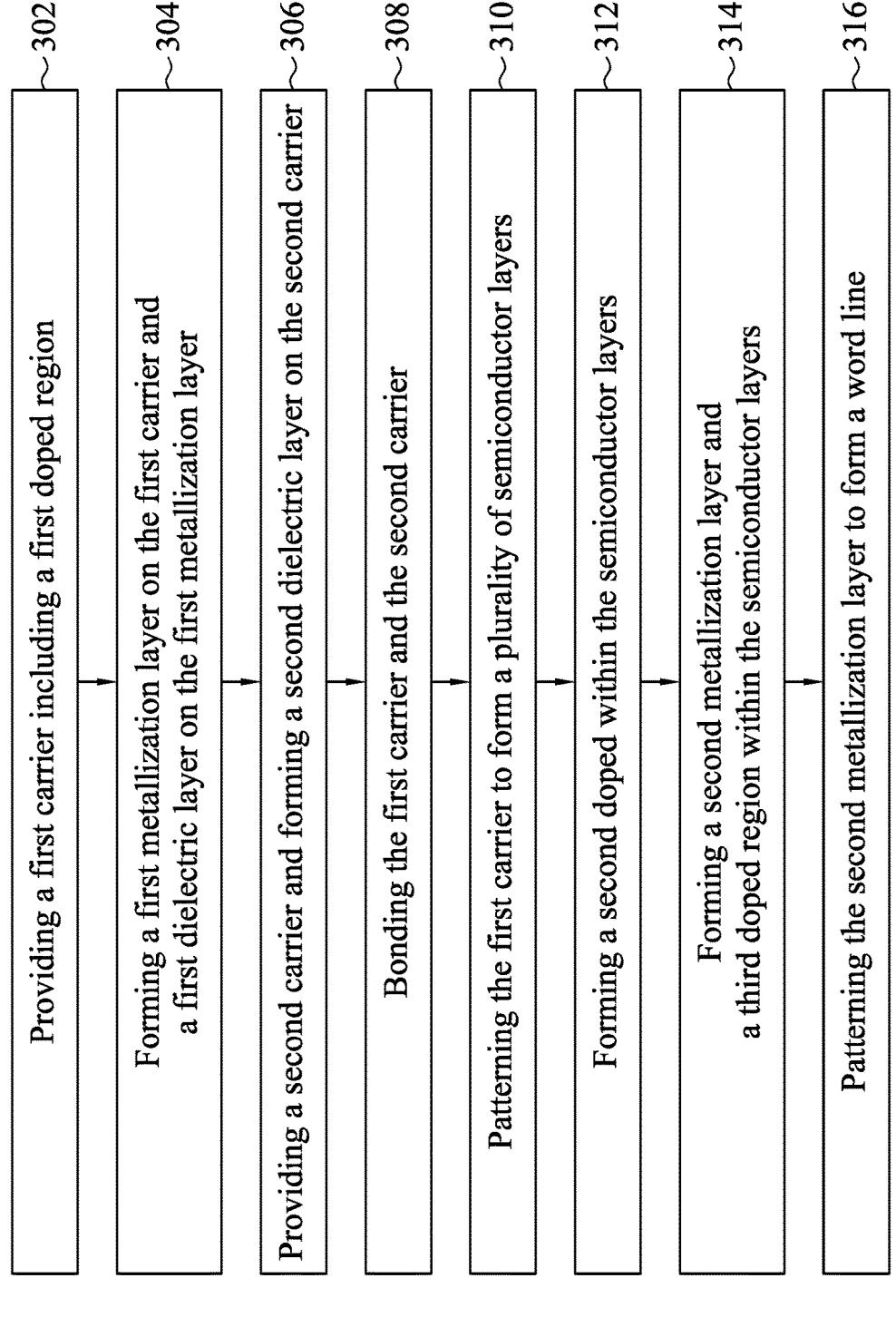

302 — Providing a first carrier including a first doped region

304 — Forming a first metallization layer on the first carrier and a first dielectric layer on the first metallization layer 306 — Providing a second carrier and forming a second dielectric layer on the second carrier 308 — Bonding the first carrier and the second carrier 310 — Patterning the first carrier to form a plurality of semiconductor layers 312 — Forming a second doped within the semiconductor layers 314 — Forming a second metallization layer and a third doped region within the semiconductor layers 316 — Patterning the second metallization layer to form a word line

SEMICONDUCTOR DEVICE HAVING SEMICONDUCTOR CHANNEL LAYER AND METHOD OF MANUFACTURING THE SAME

CROSS-REFERENCE TO RELATED APPLICATION

This application is a divisional application of U.S. Non-Provisional application Ser. No. 17/953,522 filed Sep. 27, 2022, which is incorporated herein by reference in its entirety.

TECHNICAL FIELD

The present disclosure relates to a semiconductor device and method of manufacturing the same, and in particularly to a semiconductor layer with multiple doped regions.

DISCUSSION OF THE BACKGROUND

With the rapid growth of the electronics industry, the development of integrated circuits (ICs) has achieved high performance and miniaturization. Technological advances in IC materials and design have produced generations of ICs where each generation has smaller and more complex circuits than the previous generation.

A Dynamic Random Access Memory (DRAM) device is a type of random access memory that stores each bit of data in a separate capacitor within an integrated circuit. Typically, a DRAM is arranged in a square array of one capacitor and transistor per cell. A vertical transistor has been developed for the $4F^2$ DRAM cell, where F stands for the photolithographic minimum feature width or critical dimension (CD). However, recently, DRAM manufacturers face the tremendous challenge of shrinking the memory cell area as the word line spacing continues to shrink.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device. The semiconductor device includes a substrate, a bit line, a semiconductor layer, and a word line. The bit line is disposed over the substrate. The semiconductor layer is disposed over the bit line. The word line abuts the semiconductor layer. The word line has a lower surface facing the substrate and an upper surface opposite to the lower surface. The semiconductor layer includes a first doped region with a first conductive type and a second doped region with a second conductive type opposite to the first conductive type. The first doped region is disposed between the second doped region and the bit line. The first boundary between the first doped region and the second doped region is substantially aligned with the lower surface of the word line.

Another aspect of the present disclosure provides a semiconductor device. The semiconductor device includes a substrate, a bit line, a plurality of semiconductor layers, a plurality of word lines, and a semiconductor connection structure. The bit line is disposed over the substrate. The semiconductor layer is disposed over the bit line. Each of the word lines surrounds a respective one of the plurality of semiconductor layers. The semiconductor connection structure connects the plurality of semiconductor layers.

Another aspect of the present disclosure provides a method for manufacturing a semiconductor device. The method includes providing a first substrate. The method also includes forming a bit line over the first substrate. The method further includes forming a semiconductor layer over the first substrate. The semiconductor layer comprises a first conductive type. In addition, the method includes forming a first doped region in the semiconductor layer. The first doped region has a second conductive type different from the first conductive type. The first doped region abuts the bit line. The method also includes forming a second doped region in the semiconductor layer. The second doped region has the second conductive type. The first doped region is spaced apart from the second doped region. The method further includes forming a word line abutting the semiconductor layer.

The embodiments of the present disclosure provide a semiconductor device and method of manufacturing the same. The semiconductor device may include a semiconductor layer with doped regions serving as source, drain, and/or channel. In this embodiment, the length of the channel may be determined by a vertical length of a word line, which may be precisely controlled. Further, the semiconductor layer and some of the doped regions therein may be formed in one wafer, which will be bonded to another wafer containing gate structures or other elements sensitive to thermal budget. In this condition, the features in a respective wafer may be formed without considering thermal budget of the features formed the other wafer.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

FIG. 3 is a flowchart illustrating a method of manufacturing a semiconductor device, in accordance with some embodiments of the present disclosure.

DETAILED DESCRIPTION

Figure 1:
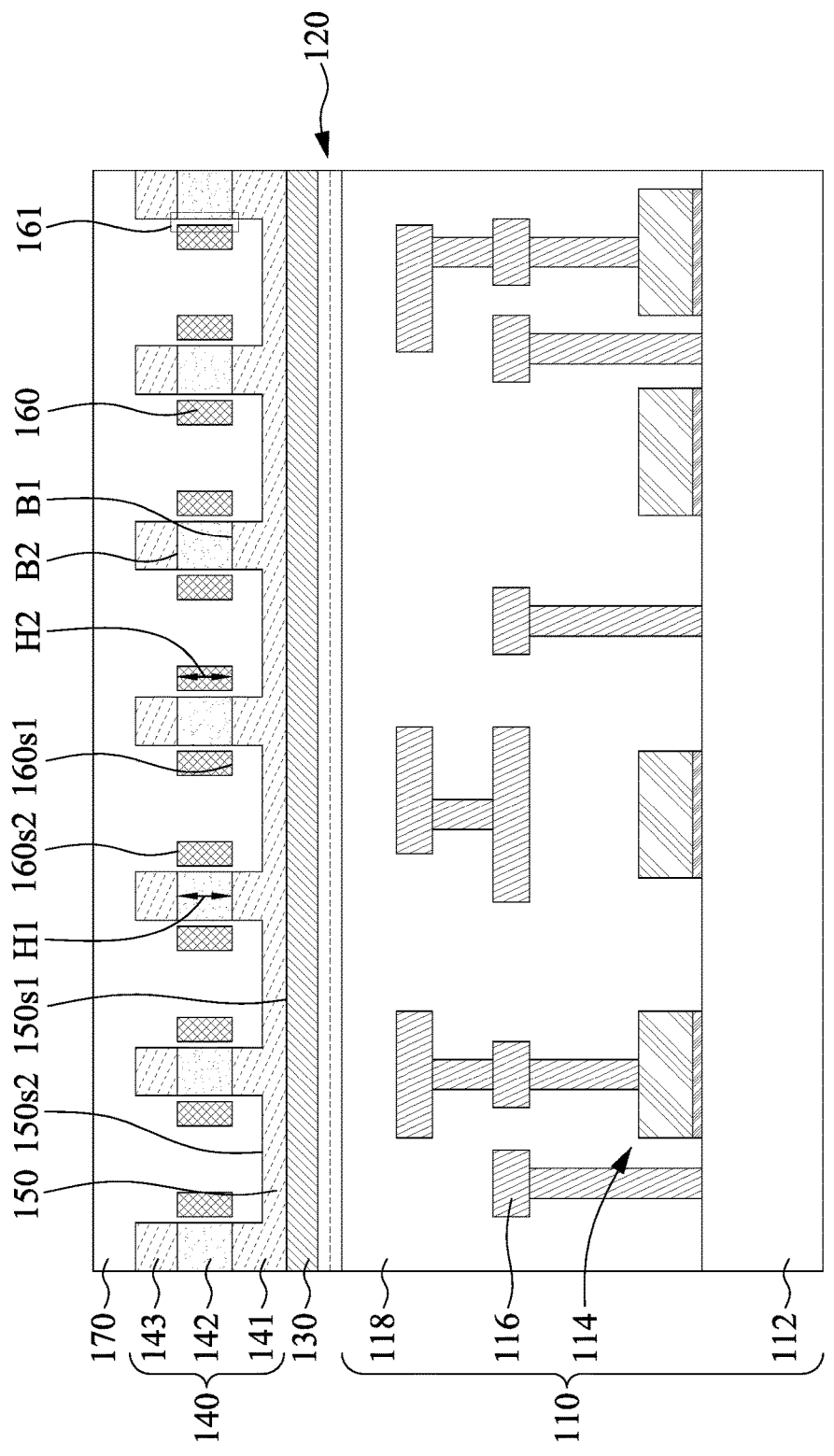
FIG. 1 is a cross-sectional view of a semiconductor device, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that when an element is referred to as being "connected to" or "coupled to" another element, the initial element may be directly connected to, or coupled to, another element, or to other intervening elements.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

It should be noted that the term "about" modifying the quantity of an ingredient, component, or reactant of the present disclosure employed refers to variation in the numerical quantity that may occur, for example, through typical measuring and liquid handling procedures used for making concentrates or solutions. Furthermore, variation may occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. In yet another aspect, the term "about" means within 10, 9, 8, 7, 6, 5, 4, 3, 2, or 1% of the reported numerical value.

FIG. 1 is a cross-sectional view of a semiconductor device 100, in accordance with some embodiments of the present disclosure. In some embodiments, the semiconductor device 100 may be applicable to a memory device, such as a dynamic random access memory (DRAM) device, a one-time programming (OTP) memory device, a static random access memory (SRAM) device, or other suitable memory devices. During read operation, a word line can be asserted, turning on the transistor. The enabled transistor allows the voltage across the capacitor to be read by a sense amplifier through a bit line. During a write operation, the data to be written can be provided on the bit line when the word line is asserted.

In some embodiments, the semiconductor device 100 may include a carrier 110, a bonding structure 120, a bit line 130, a semiconductor layer 140, a semiconductor connection structure 150, word lines 160, and a dielectric structure 170.

The carrier 110 may be utilized to bond with another carrier, such as a wafer. The carrier 110 may include a substrate 112, a plurality of transistors 114, conductive structures 116, and a dielectric structure 118.

The substrate 112 may be a semiconductor substrate, such as a bulk semiconductor, a semiconductor-on-insulator (SOI) substrate, or the like. The substrate 112 may include an elementary semiconductor including silicon or germanium in a single crystal form, a polycrystalline form, or an amorphous form, a compound semiconductor material including at least one of silicon carbide, gallium arsenide, gallium phosphide, indium phosphide, indium arsenide, and indium antimonide, an alloy semiconductor material including at least one of SiGe, GaAsP, AlInAs, AlGaAs, GaInAs, GaInP, and GaInAsP, any other suitable material, or a combination thereof. In some embodiments, the alloy semiconductor substrate may include a SiGe alloy with a gradient Ge feature in which the Si and Ge composition changes from one ratio at one location to another ratio with location of the feature. In another embodiment, the SiGe alloy is formed over a silicon substrate. In some embodiments, a SiGe alloy may be mechanically strained by another material in contact with the SiGe alloy. In some embodiments, the substrate 112 may have a multilayer structure, or the substrate 112 may include a multilayer compound semiconductor structure. It should be noted that some doped regions, isolation structures, and/or other features may be formed within the substrate 112.

The transistors 114 may be disposed over the substrate 112. The transistors 114 may include, for example, metal oxide semiconductor (MOS), such as PMOS, NMOS, and/or CMOS.

The conductive structures 116 may be utilized to electrically connect the transistors 114 and/or other components. The conductive structure 116 may include copper (Cu), tungsten (W), aluminum (Al), tantalum (Ta), molybdenum (Mo), tantalum nitride (TaN), titanium, titanium nitride (TiN), the like, and/or a combination thereof.

The dielectric structure 118 may cover the transistors 114 and the conductive structures 116. The dielectric structure 118 may include a multi-layered structure. The dielectric structure 118 may include, for example, silicon oxide ($SiO_x$), silicon nitride ($Si_xN_y$), silicon oxynitride (SiON), phosphosilicate glass (PSG), borophosphosilicate glass (BPSG), a low-k dielectric material (k<4), or other suitable materials.

In some embodiments, the bonding structure 120 may be disposed on the carrier 110. In some embodiments, the bonding structure 120 may include a dielectric material. In some embodiments, the bonding structure 120 may be formed by bonding two dielectric layers. In some embodiments, the bonding structure 120 may include silicon oxide ($SiO_x$), silicon nitride ($Si_xN_y$), silicon oxynitride (SiON), or a combination thereof.

In some embodiments, the bit line 130 may be disposed on the bonding structure 120. In some embodiments, the bit line 130 may be in contact with the bonding structure 120. The bit line 130 may include conductive materials, such as tungsten, copper, aluminum, tantalum, tantalum nitride, titanium, titanium nitride, the like, and/or a combination thereof.

In some embodiments, the semiconductor layer 140 may be disposed on the bit line 130. In some embodiments, the semiconductor layer 140 may be in contact with the bit line 130. In some embodiments, the semiconductor layer 140 may include a semiconductor material, such as silicon, germanium, tin, antimony or a combination thereof. In some embodiments, the semiconductor layer 140 may be configured to transmit carriers, such as electrons and/or holes.

In some embodiments, the semiconductor layer 140 may include a doped region 141, a doped region 142, and a doped region 143. In some embodiments, the doped region 141 may abut the bit line 130. In some embodiments, the doped region 141 may be disposed on the bit line 130. In some embodiments, the doped region 141 may be in contact with the bit line 130. In some embodiments, the doped region 141 may have a first conductive type. In some embodiments, the first conductive type may be an n type or a p type. In some embodiments, n type dopants, such as arsenic (As), phosphorus (P), other group V elements, or any combination thereof, may be doped into the doped region 141. In some embodiments, p type dopants, such as boron (B), other group III elements, or any combination thereof, may be doped into the doped region 141. In some embodiments, the doped region 141 may be formed by a diffusion technique. In some embodiments, the dopant concentration in the doped region 141 may be nonuniform. In some embodiments, the doped region 141 has a greater dopant concentration in a region close to a lateral surface (not annotated) or close to an external surface and a smaller dopant concentration in a region far from the lateral surface or the external surface.

In some embodiments, the doped region 142 may be disposed on the doped region 141. In some embodiments, the doped region 142 may be disposed between the doped region 143 and the doped region 141. In some embodiments, the doped region 142 may be in contact with the doped region 141. In some embodiments, the doped region 142 may have a second conductive type different from the first conductive type. In some embodiments, the doped region 142 has a relatively uniform dopant concentration distribution than that of the doped region 141.

In some embodiments, the doped region 143 may be disposed on the doped region 142. In some embodiments, the doped region 143 may be in contact with the doped region 142. In some embodiments, the doped region 143 may have the first conductive type. In some embodiments, the doped region 143 may be formed by an ion-implant technique. In some embodiments, the doped region 143 has a relatively uniform dopant concentration distribution than that of the doped region 141. In some embodiments, the dopant in the doped region 143 may be different from the dopant in the doped region 141. In some embodiments, the dopant in the doped region 143 has an atomic number greater than that in the doped region 141. In some embodiments, when the first type is n type, the dopant in the doped region 141 may include phosphorus, and the dopant in the doped region 143 may include arsenic.

In some embodiments, the dopant concentration of the doped region 141 may be greater than that of the doped region 142. In some embodiments, the dopant concentration of the doped region 143 may be greater than that of the doped region 142.

In some embodiments, the semiconductor connection structure 150 may be disposed on the bit line 130. In some embodiments, the semiconductor connection structure 150 may be in contact with the bit line 130. In some embodiments, the semiconductor layer may protrude from the semiconductor connection structure 150. In some embodiments, the semiconductor connection structure 150 may connect the plurality of semiconductor layer 140. In some embodiments, the semiconductor connection structure 150 may be in contact with the semiconductor layer 140. In some embodiments, the semiconductor connection structure 150 may be in contact with the doped region 141. In some embodiments, the semiconductor connection structure 150 may have the first conductive type. In some embodiments, the dopant in the semiconductor connection structure 150 may be the same as that in the doped region 141. In some embodiments, the semiconductor connection structure 150 may have a smaller dopant concentration at a surface 150s1 (or a lower surface) of the semiconductor connection structure 150 and a greater dopant concentration at a surface 150s2 (or an upper surface) of the semiconductor connection structure 150. The semiconductor connection structure 150 may include a semiconductor material, such as silicon, germanium, tin, antimony or a combination thereof.

In some embodiments, each of the word lines 160 may abut the semiconductor layer 140. The word line 160 may be disposed on a lateral surface (not annotated) of the semiconductor layer 140. In some embodiments, the word line 160 may surround the semiconductor layer 140. In some embodiments, the word line 160 may enclose the semiconductor layer 140. In some embodiments, the word line 160 may have a ring-shape profile from a top view. In some embodiments, the word line 160 may cover a portion of the lateral surface of the semiconductor layer 140. In some embodiments, a portion of the semiconductor layer 140 may be exposed by the word line 160. In some embodiments, the doped region 142 may be completely covered by the word line 160. In some embodiments, at least a portion of the doped region 141 may be exposed from the word line 160. In some embodiments, at least a portion of the doped region 143 may be exposed from the word line 160. In some embodiments, the word line 160 may cover a portion of the semiconductor connection structure 150. The word line 160 may include conductive materials, such as tungsten, copper, aluminum, tantalum, tantalum nitride, titanium, titanium nitride, the like, and/or a combination thereof.

The word line 160 may have a surface 160s1 (or a lower surface) and a surface 160s2 (or an upper surface) opposite to the surface 160s1. In some embodiments, the surface 160s1 of the word line 160 may be aligned with a boundary B1 between the doped region 141 and the doped region 142 of the semiconductor layer 140. In some embodiments, the surface 160s2 of the word line 160 may be aligned with a boundary B2 between the doped region 142 and the doped region 143 of the semiconductor layer 140. In other embodiments, the boundary B1 may be located at a horizontal level higher than that of the surface 160s1 of the word line 160.

The doped region 142 of the semiconductor layer 140 may have a vertical length H1. The word line 160 may have a vertical length H2. In some embodiments, the vertical length H1 may be substantially identical to the vertical length H2.

In some embodiments, the word line 160 may function as a gate electrode. In some embodiments, the doped region 141 may function as a source or a drain region. In some embodiments, the doped region 142 may function as a channel region. In some embodiments, the doped region 143 may function as a source or a drain region.

In some embodiments, the semiconductor device may further include a gate dielectric layer 161. The gate dielectric layer 161 may be disposed between the semiconductor layer 140 and the word line 160. The gate dielectric layer 161 may include silicon oxide ($SiO_x$), silicon nitride ($Si_xN_y$), silicon oxynitride (SiON), or a combination thereof. In some embodiments, the gate dielectric layer 161 may include dielectric material(s), such as high-k dielectric material. The high-k dielectric material may have a dielectric constant (k value) greater than 4. The high-k material may include hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material.

The dielectric structure 170 may be disposed on the semiconductor layer 140. The dielectric structure 170 may cover the word line 160. The dielectric structure 170 may include silicon oxide, silicon nitride, silicon oxynitride, phosphosilicate glass, borophosphosilicate glass, a low-k dielectric material (k<4), or other suitable materials.

The semiconductor device 100 may further a plurality of capacitors (not shown). In some embodiments, the capacitor may be disposed over the semiconductor layer 140. In some embodiments, the capacitor may be electrically connected to the semiconductor layer 140 through a contact plug (not shown) penetrating the dielectric structure 170. The word line 160 may serve as a part of a switch to turn on and/or turn off the capacitor.

Figure 2:
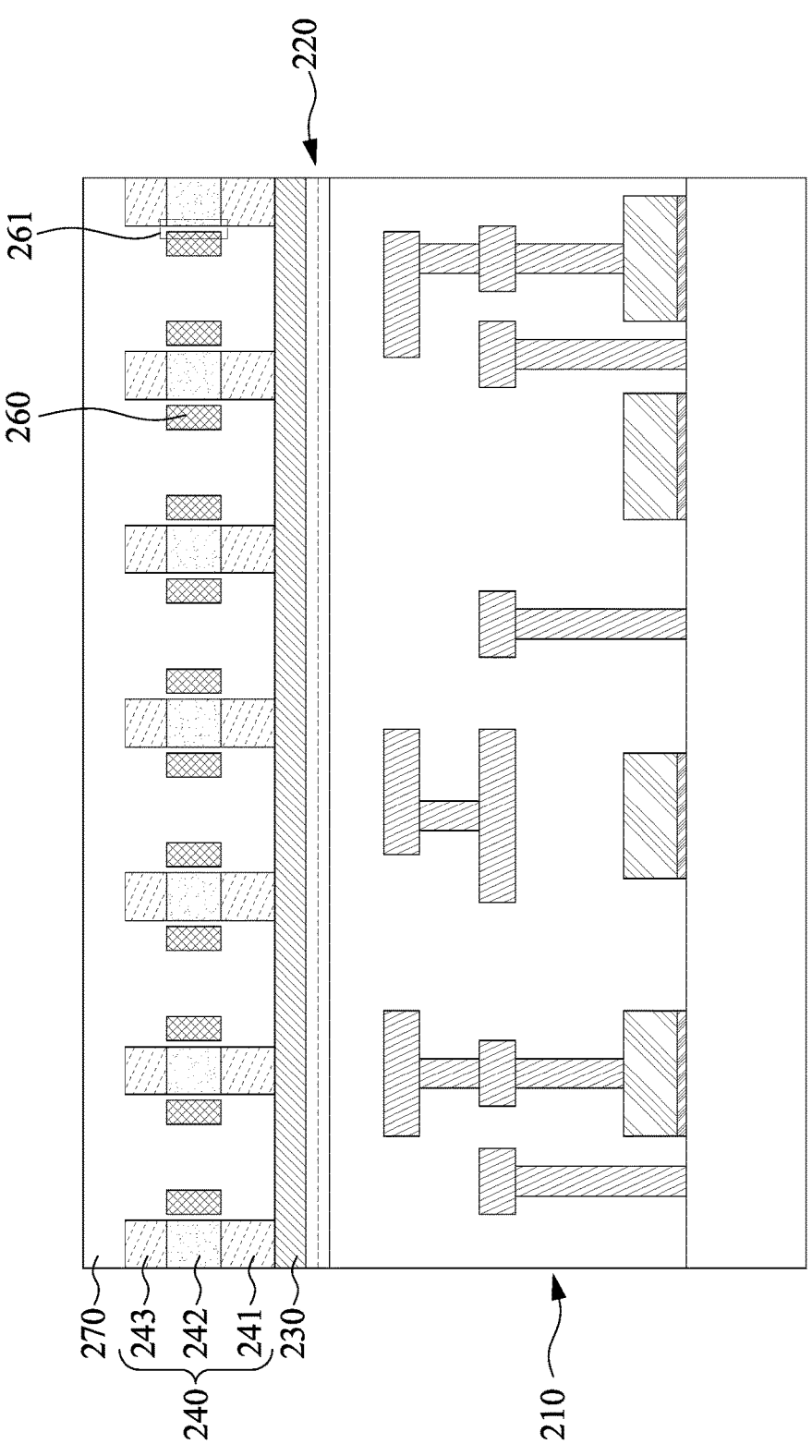
FIG. 2 is a cross-sectional view of a semiconductor device, in accordance with some embodiments of the present disclosure.

FIG. 2 is a cross-sectional view of a semiconductor device 200, in accordance with some embodiments of the present disclosure. In some embodiments, the semiconductor device 200 may be applicable to a memory device, such as a dynamic random access memory device, a one-time programming memory device, a static random access memory device, or other suitable memory devices.

In some embodiments, the semiconductor device 200 may include a carrier 210, a bonding structure 220, a bit line 230, a semiconductor layer 240, a word line 260, and a dielectric structure 270.

The carrier 210 may be utilized to bond with another carrier, such as a wafer. The carrier 210 may include a semiconductor substrate, transistors (e.g., PMOS, NMOS, and CMOS), conductive traces, vias, and dielectric layers.

In some embodiments, the bonding structure 220 may be disposed on the carrier 210. In some embodiments, the bonding structure 220 may include a dielectric material. In some embodiments, the bonding structure 220 may be formed by bonding two dielectric layers.

In some embodiments, the bit line 230 may be disposed on the bonding structure 220. In some embodiments, the bit line 230 may be in contact with the bonding structure 220. The bit line 230 may include conductive materials.

In some embodiments, the semiconductor layer 240 may be disposed on the bit line 230. In some embodiments, the semiconductor layer 240 may be in contact with the bit line 230. In some embodiments, the semiconductor layer 240 may include a semiconductor material, such as silicon, germanium, tin, antimony or a combination thereof. In some embodiments, the semiconductor layer 240 may be configured to transmit carriers, such as electrons and/or holes.

In some embodiments, the semiconductor layer 240 may include a doped region 241, a doped region 242, and a doped region 243. In some embodiments, the doped region 241 may be disposed on the bit line 230. In some embodiments, the doped region 241 may be in contact with the bit line 230. In some embodiments, the doped region 241 may have a first conductive type. In some embodiments, the doped region 241 may be formed by a diffusion technique. In some embodiments, the dopant concentration in the doped region 241 may be nonuniform. In some embodiments, the doped region 241 has a greater dopant concentration in a region close to a lateral surface (not annotated) or close to an external surface and a smaller dopant concentration in a region far from the lateral surface or the external surface.

In some embodiments, the doped region 242 may be disposed on the doped region 241. In some embodiments, the doped region 242 may be disposed between the doped region 243 and the doped region 241. In some embodiments, the doped region 242 may be in contact with the doped region 241. In some embodiments, the doped region 242 may have a second conductive type different from the first conductive type.

In some embodiments, the doped region 243 may be disposed on the doped region 242. In some embodiments, the doped region 243 may be in contact with the doped region 242. In some embodiments, the doped region 243 may have the first conductive type. In some embodiments, the doped region 243 may be formed by an ion-implant technique. In some embodiments, the doped region 243 has a relatively uniform dopant concentration distribution than that of the doped region 241. In some embodiments, the dopant in the doped region 243 may be different from the dopant in the doped region 241. In some embodiments, the dopant in the doped region 243 has an atomic number greater than that in the doped region 241.

In some embodiments, the word line 260 may abut the semiconductor layer 240. The word line 260 may be disposed on a lateral surface (not annotated) of the semiconductor layer 240. In some embodiments, the word line 260 may surround the semiconductor layer 240. In some embodiments, the word line 260 may enclose the semiconductor layer 240. In some embodiments, the word line 260 may have a ring-shape profile from a top view. In some embodiments, the word line 260 may cover a portion of the lateral surface of the semiconductor layer 240. In some embodiments, a portion of the semiconductor layer 240 may be exposed by the word line 260. In some embodiments, the doped region 242 may be completely covered by the word line 260. In some embodiments, at least a portion of the doped region 241 may be exposed from the word line 260. In some embodiments, at least a portion of the doped region 243 may be exposed from the word line 260.

In some embodiments, the semiconductor device may further include a gate dielectric layer 261. The gate dielectric layer 261 may be disposed between the semiconductor layer 240 and the word line 260. The gate dielectric layer 261 may include silicon oxide ($SiO_x$), silicon nitride ($Si_xN_y$), silicon oxynitride (SiON), or a combination thereof.

The dielectric structure 270 may be disposed on the semiconductor layer 240. The dielectric structure 270 may cover the word line 260. The dielectric structure 270 may include silicon oxide, silicon nitride, silicon oxynitride, phosphosilicate glass, borophosphosilicate glass, a low-k dielectric material (k<4), or other suitable materials.

FIG. 3 is a flowchart illustrating a method 300 of manufacturing a semiconductor device, in accordance with some embodiments of the present disclosure.

The method 300 begins with operation 302 in which a first carrier may be provided. A first doped region may be formed within the first carrier, and the first doped region has a first conductive type.

The method 300 continues with operation 304 in which a first metallization layer is formed on the first carrier, and a first dielectric layer are formed on the first metallization layer.

The method 300 continues with operation 306 in which a second carrier is provided. A plurality of transistors are formed within the second carrier. A second dielectric layer is formed on the second carrier.

The method 300 continues with operation 308 in which the second carrier is bonded by bonding the second dielectric layer to the first dielectric layer.

The method 300 continues with operation 310 in which the first carrier is patterned to form a plurality of semiconductor layers and a semiconductor connection structure connecting the plurality of semiconductor layers. The first metallization layer is patterned to form a plurality of bit lines.

The method 300 continues with operation 312 in which a second doped region is formed. The second doped region has a second conductive type different from the first conductive type. The second doped region abuts the semiconductor connection structure. The second doped region is formed by diffusing first dopants in a dopant diffusion layer into the semiconductor layer.

The method 300 continues with operation 314 in which a second metallization layer is formed. A third doped region is formed within the semiconductor layer. The third doped region has the second conductive type. The third doped region is formed by an implant technique to dope second dopants into the semiconductor layer. The second doped region is spaced apart from the third doped region by the first doped region. The second doped region and the third doped region may serve as a source/drain. The first doped region may serve as a channel. The length of the channel may depend on a vertical length of the second metallization layer.

The method 300 continues with operation 316 in which the second metallization layer is patterned to form a word line. The word line surrounds the semiconductor layer. A semiconductor device is produced.

In this embodiment, the semiconductor layer, serving as the channel, is formed in another wafer different from the wafer which logic circuits are formed within. The doped regions serving as source and drain are formed after two wafers are bonded. Further, the doped regions serving as source and drain are formed by different methods. As a result, the length of the channel may be determined by the word line. Further, the features in a respective wafer may be formed without considering thermal budget of the features formed the other wafer, facilitating the manufacturing processes.

The method 300 is merely an example, and is not intended to limit the present disclosure beyond what is explicitly recited in the claims. Additional operations can be provided before, during, or after each operation of the method 300, and some operations described can be replaced, eliminated, or reordered for additional embodiments of the method. In some embodiments, the method 300 can include further operations not depicted in FIG. 3. In some embodiments, the method 300 can include one or more operations depicted in FIG. 3.

FIG. 4 to FIG. 22 illustrate one or more stages of an exemplary method for manufacturing a semiconductor device according to some embodiments of the present disclosure.

Figure 4:
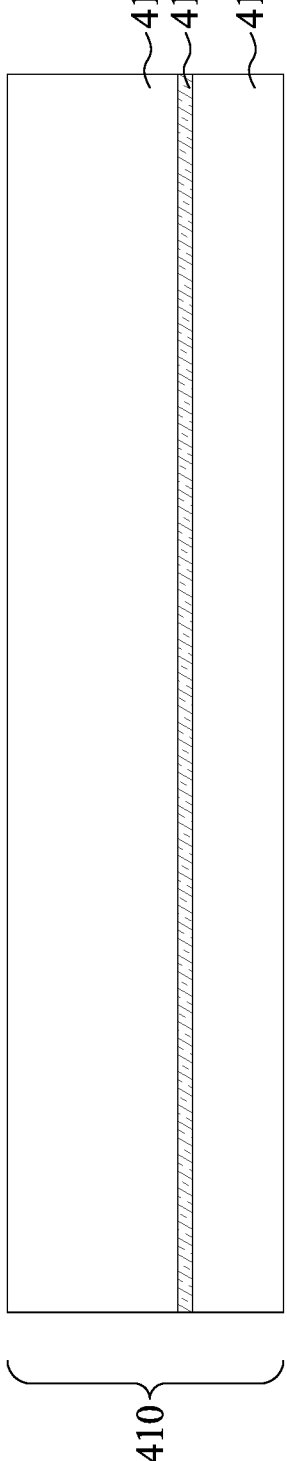
FIG. 4 illustrates one or more stages of an exemplary method for manufacturing a semiconductor device according to some embodiments of the present disclosure.

Referring to FIG. 4, a carrier 410 may be provided. In some embodiments, the carrier 410 may be a wafer. The carrier 410 may be a semiconductor substrate, such as a bulk semiconductor, a semiconductor-on-insulator (SOI) substrate, or the like. The carrier 410 may include an elementary semiconductor including silicon or germanium in a single crystal form, a polycrystalline form, or an amorphous form, a compound semiconductor material including at least one of silicon carbide, gallium arsenide, gallium phosphide, indium phosphide, indium arsenide, and indium antimonide, an alloy semiconductor material including at least one of SiGe, GaAsP, AlInAs, AlGaAs, GaInAs, GaInP, and GaInAsP, any other suitable material, or a combination thereof. In some embodiments, the alloy semiconductor substrate may include a SiGe alloy with a gradient Ge feature in which the Si and Ge composition changes from one ratio at one location to another ratio with location of the feature. In another embodiment, the SiGe alloy is formed over a silicon substrate. In some embodiments, a SiGe alloy may be mechanically strained by another material in contact with the SiGe alloy. The carrier 410 may include a support part 412, a detach part 414, and a transfer part 416. The detach part 414 may be formed between the support part 412 and the transfer part 416.

Figure 5:
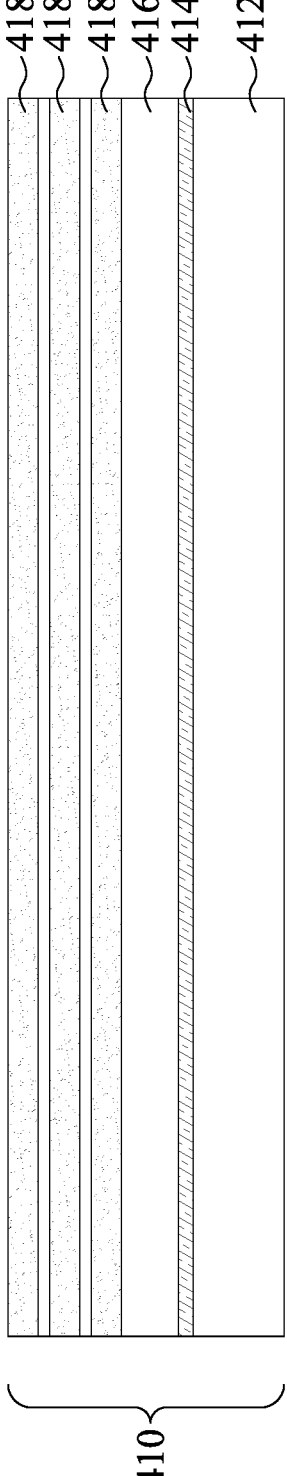
FIG. 5 illustrates one or more stages of an exemplary method for manufacturing a semiconductor device according to some embodiments of the present disclosure.

Referring to FIG. 5, a plurality of doped regions 418 may be formed within the carrier 410. The doped region 418 may be formed by an ion-implant technique or other suitable methods. In some embodiments, the plurality of doped regions 418 may be formed within the transfer part 416 of the carrier 410. In some embodiments, each of the doped regions 418 may have the second conductive type. Although FIG. 5 illustrates that the carrier 410 has three doped regions 418 therein, four or more doped regions 418 may be implanted into the carrier 410 in other embodiments. In some embodiments, a sacrificial oxide layer (not shown) may be formed on the transfer part 416 of the carrier 410, which will be removed in subsequent processes.

Figure 6:
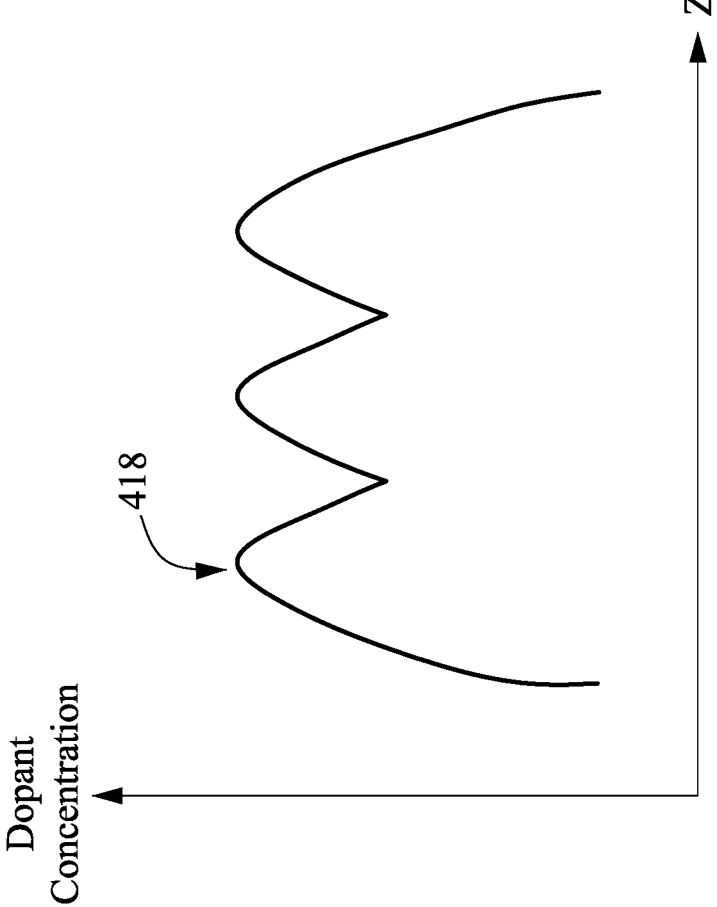
FIG. 6 illustrates a chart showing dopant concentration verses Z-direction shown in FIG. 5 for doped regions according to some embodiments of the present disclosure.

Referring to FIG. 6, FIG. 6 illustrates a chart showing dopant concentration verses Z-direction shown in FIG. 5 for doped regions 418 according to some embodiments of the present disclosure. The Z-direction is a direction extending from the transfer part 416 to the support part 412. The energy and the dose of the implant technique may be predetermined and modified based on design requirements. Each of the dopant concentrations of the doped region 418 may provide a profile similar to a Gaussian shape. Each of the doped regions 418 may have a relatively nonuniform dopant concentration verses Z-direction.

Figure 7:
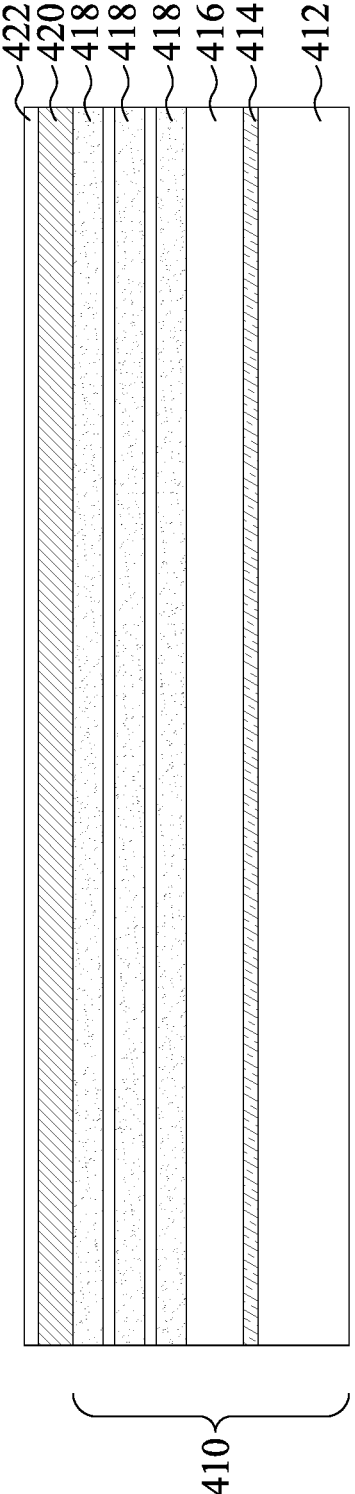
FIG. 7 illustrates one or more stages of an exemplary method for manufacturing a semiconductor device according to some embodiments of the present disclosure.

Referring to FIG. 7, a metallization layer 420 may be formed on the transfer part 416 of the carrier 410. In some embodiments, a dielectric layer 422 may be formed on the metallization layer 420. The metallization layer 420 may be formed by physical vapor deposition (PVD), chemical vapor deposition (CVD), atomic layer deposition (ALD), low-pressure chemical vapor deposition (LPCVD), or other suitable processes. In some embodiments, the dielectric layer 422 may be formed by a deposition technique, such as CVD, ALD, LPCVD, or other suitable processes. In some embodiments, the dielectric layer 422 may include, for example, silicon oxide.

Figure 8:
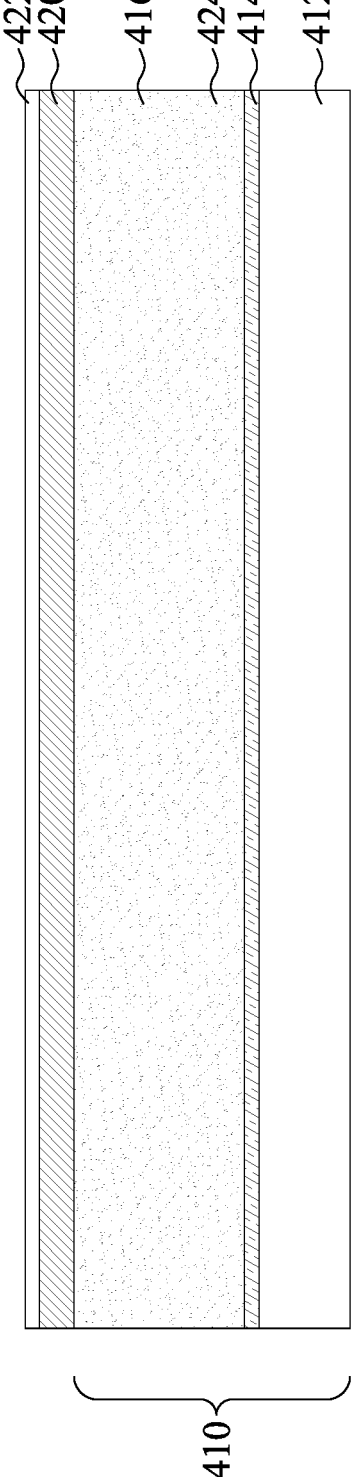
FIG. 8 illustrates one or more stages of an exemplary method for manufacturing a semiconductor device according to some embodiments of the present disclosure.

Referring to FIG. 8, an annealing technique may be performed, and a doped region 424 may be formed. In some embodiments, the doped region 424 may be formed within the transfer part 416 of the carrier 410. In some embodiments, the annealing technique may be performed at a temperature greater than 450° C., such as 450° C., 500° C., 600° C., 700° C., 800° C., 900° C., 1000° C. or more.

Figure 9:
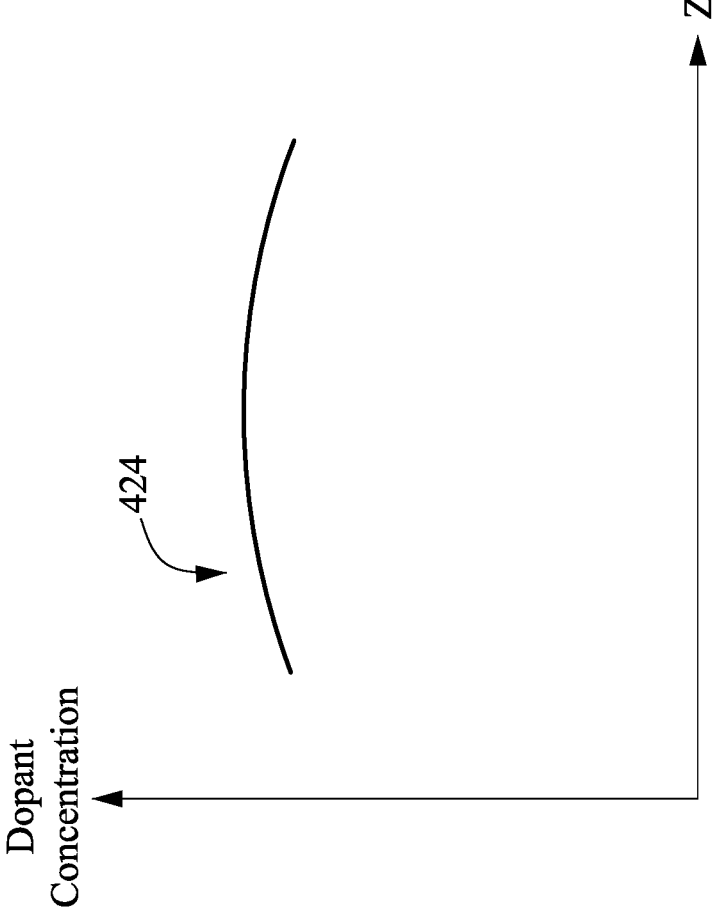
FIG. 9 illustrates a chart showing dopant concentration verses Z-direction shown in FIG. 8 for a doped region according to some embodiments of the present disclosure.

Referring to FIG. 9, FIG. 9 illustrates a chart showing dopant concentration verses Z-direction shown in FIG. 8 for the doped region 424 according to some embodiments of the present disclosure. In some embodiments, the doped region 424 may have a relatively uniform dopant concentration verses Z-direction.

Figure 10:
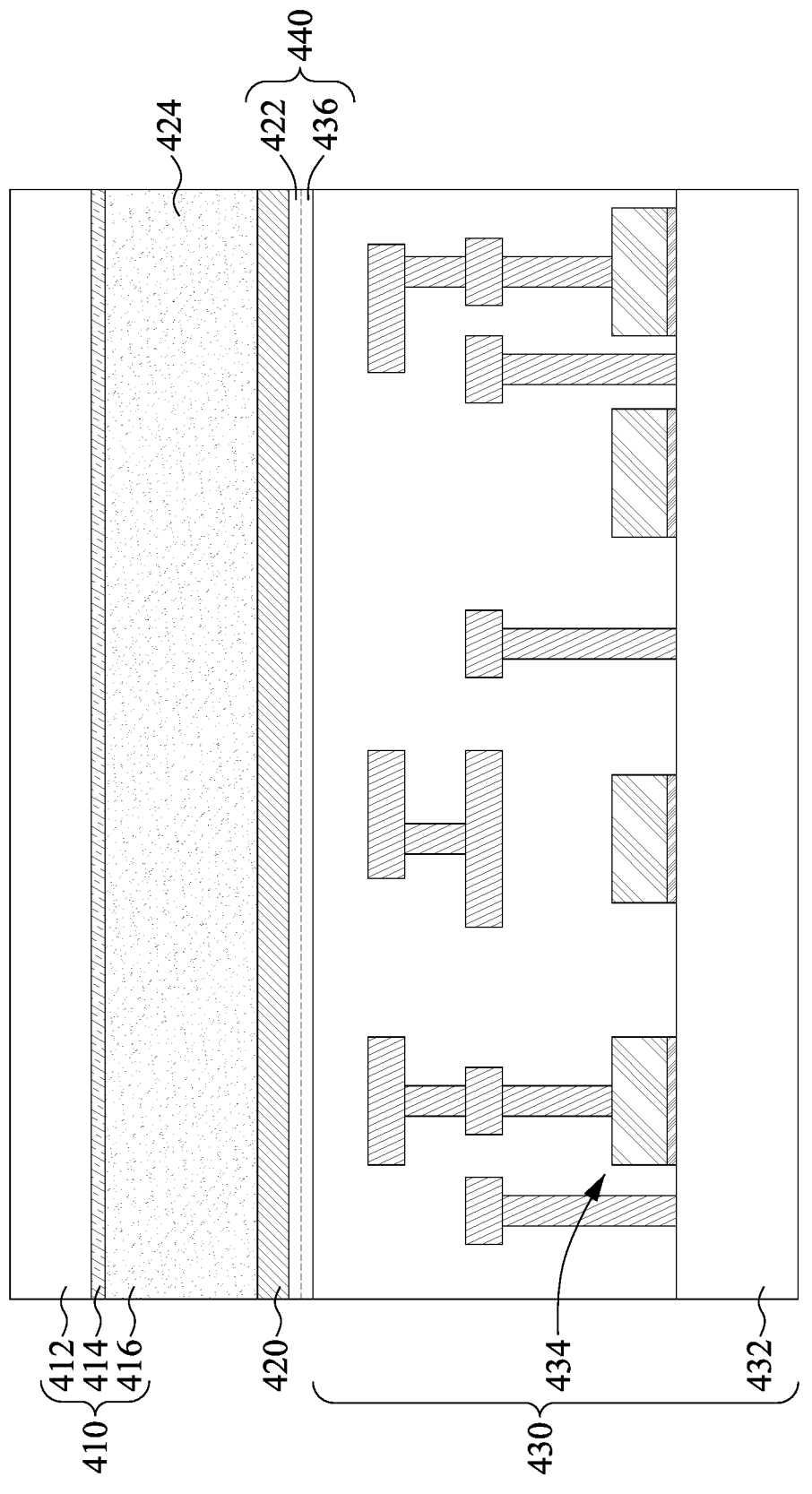
FIG. 10 illustrates one or more stages of an exemplary method for manufacturing a semiconductor device according to some embodiments of the present disclosure.

Referring to FIG. 10, a carrier 430 may be provided. The carrier 410 may be bonded to the carrier 430. The carrier 430 may be a wafer. The carrier 430 may include a substrate 432, transistors 434, and a dielectric layer 436. The substrate 432 may include a semiconductor substrate or the like. The transistors 434 may include MOS, such as PMOS, NMOS, and/or CMOS. The dielectric layer 436 may be formed on an external surface (not annotated) of the carrier 430. In some embodiments, the dielectric layer 436 may be formed by a deposition technique, such as CVD, ALD, LPCVD, or other suitable processes. In some embodiments, the dielectric layer 436 may include, for example, silicon oxide.

In some embodiments, the dielectric layer 422 may be bonded to the dielectric layer 436, thereby forming a bonding structure 440. In some embodiments, a fusion bonding technique may be utilized to bond the dielectric layer 422 and the dielectric layer 436. In some embodiments, the fusion bonding technique may be performed at a temperature ranging from about 200° C. to about 300° C.

Figure 11:
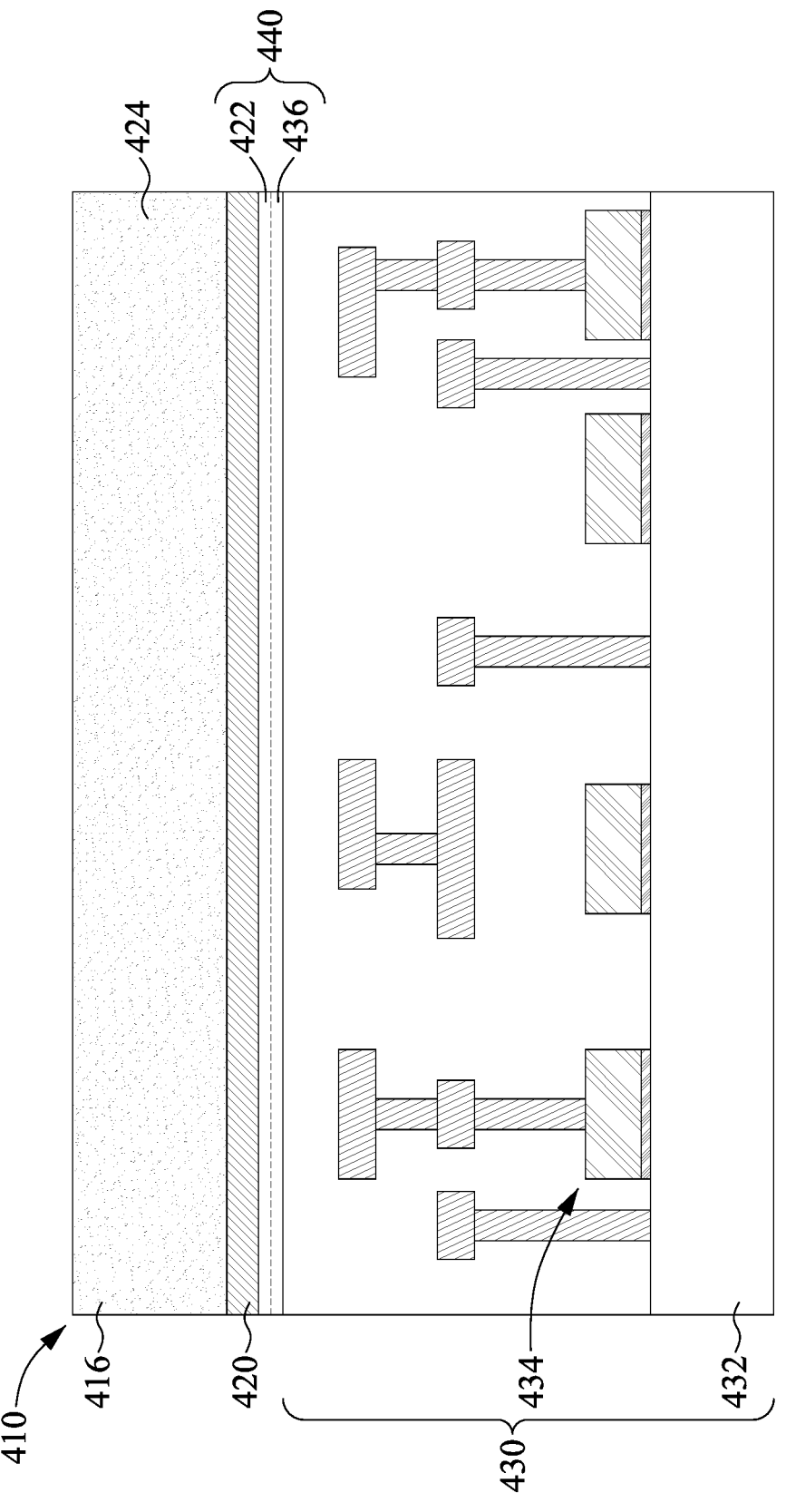
FIG. 11 illustrates one or more stages of an exemplary method for manufacturing a semiconductor device according to some embodiments of the present disclosure.

Referring to FIG. 11, a portion of the carrier 410 may be removed. In some embodiments, the support part 412 of the carrier 410 may be removed. In some embodiments, the detach part 414 of the carrier 410 may be removed. In some embodiments, the transfer part 416 may remain over the carrier 430. In some embodiments, before the support part 412 is removed, a backside surface of the support part 412 may be polished. In some embodiments, the detach part 414 may be removed by, for example, a dry etching.

Figure 12:
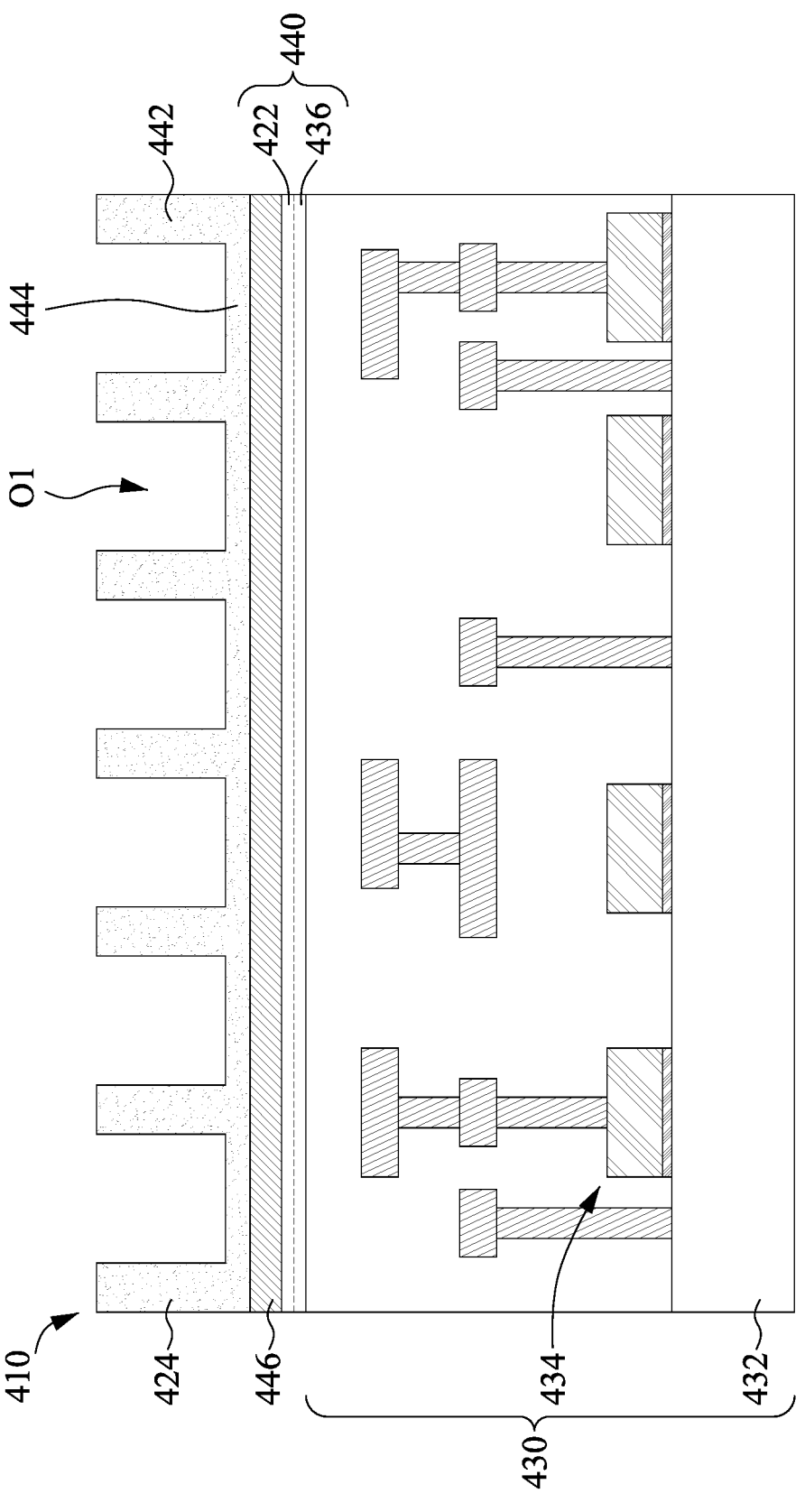
FIG. 12 illustrates one or more stages of an exemplary method for manufacturing a semiconductor device according to some embodiments of the present disclosure.

Referring to FIG. 12, the transfer part 416 of the carrier 410 may be patterned to form a plurality of semiconductor layers 442. A semiconductor connection structure 444 may be formed to connect the semiconductor layers 442. In some embodiments, the metallization layer 420 may be patterned to form a plurality of bit lines 446. Each of the bit lines 446 may be spaced apart from each other in a top view. In some embodiments, the semiconductor connection structure 444 may be in contact with the bit line 446. Openings O1 may be formed over the semiconductor connection structure 444. In some embodiments, the opening O1 may be defined by the semiconductor layer 442 and the semiconductor connection structure 444. In some embodiments, the bit line 446 may be covered by the semiconductor connection structure 444.

Figure 13:
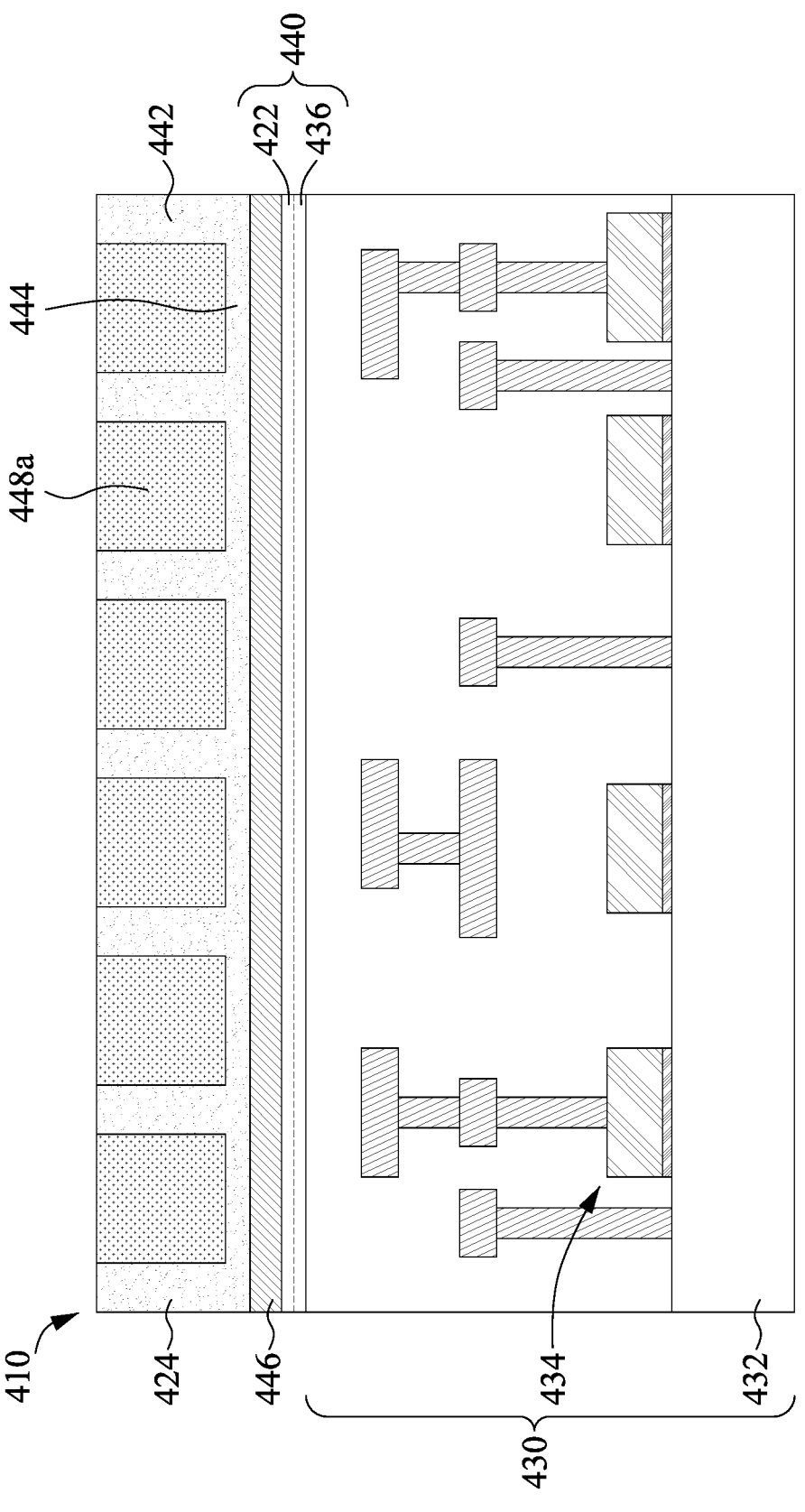
FIG. 13 illustrates one or more stages of an exemplary method for manufacturing a semiconductor device according to some embodiments of the present disclosure.

Referring to FIG. 13, a dopant diffusion layer 448a may be formed over the semiconductor connection structure 444. The dopant diffusion layer 448a may fill the openings O1. In some embodiments, the dopant diffusion layer 448a may include a dielectric material. In some embodiments, the dopant diffusion layer 448a may include dopants therein. In some embodiments, the dopants in the dopant diffusion layer 448a may have the first conductive type. In some embodiments, the dopants in the dopant diffusion layer 448a may include phosphosilicate glass (PSG), phosphorus doped-spin-on glass (SOG), boron-doped zinc oxide, or other suitable materials. In some embodiments, a polishing technique, such as chemical-mechanical polishing (CMP), may be performed to remove excessive portions of the dopant diffusion layer 448a.

Figure 14:
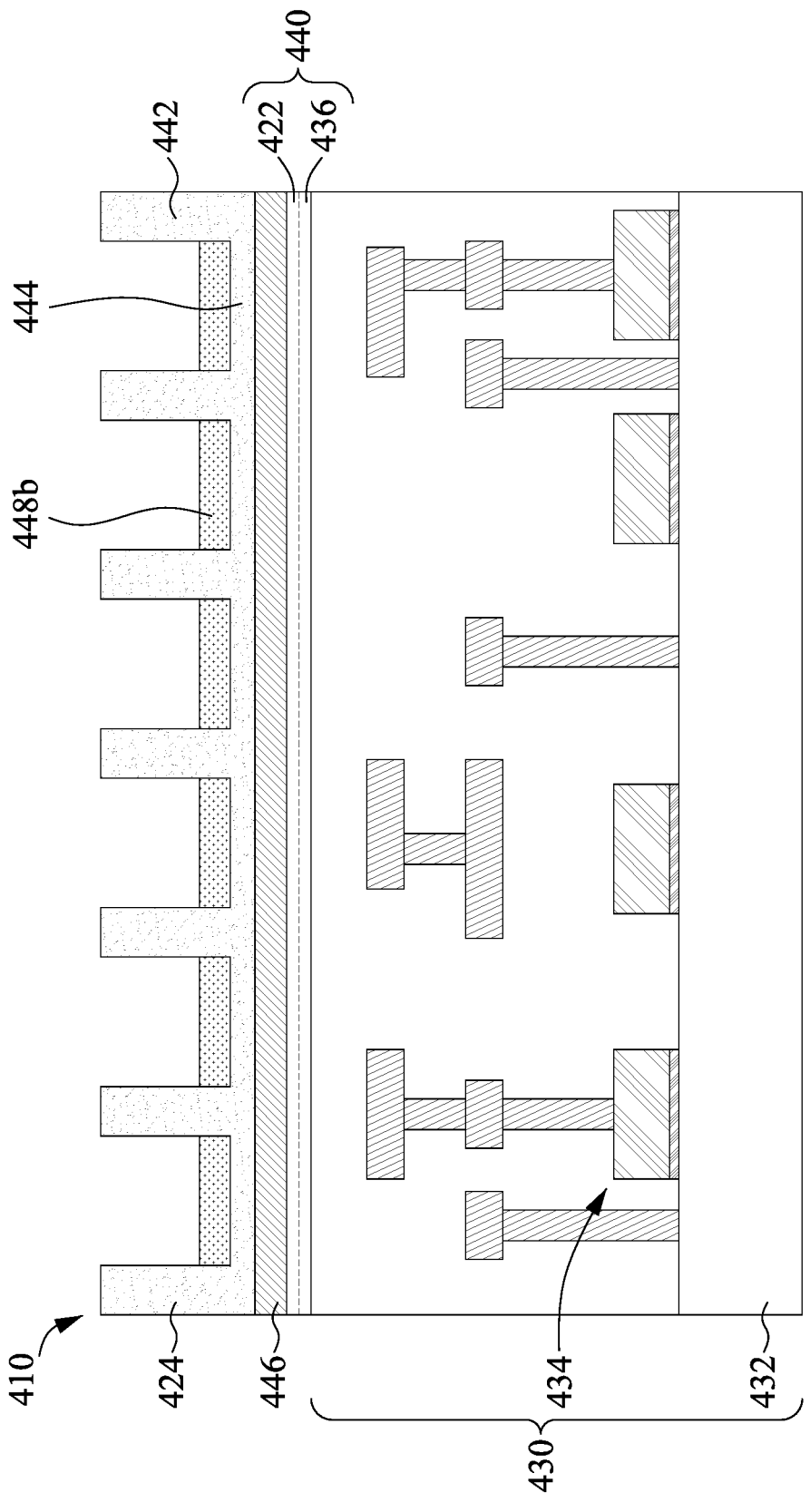
FIG. 14 illustrates one or more stages of an exemplary method for manufacturing a semiconductor device according to some embodiments of the present disclosure.

Referring to FIG. 14, a portion of the dopant diffusion layer 448a may be removed to form a dopant diffusion layer 448b. In some embodiments, a portion of a lateral surface of the semiconductor layer 442 may be covered by the dopant diffusion layer 448b. In some embodiments, a portion of a lateral surface of the semiconductor layer 442 may be exposed from the dopant diffusion layer 448b.

Figure 15:
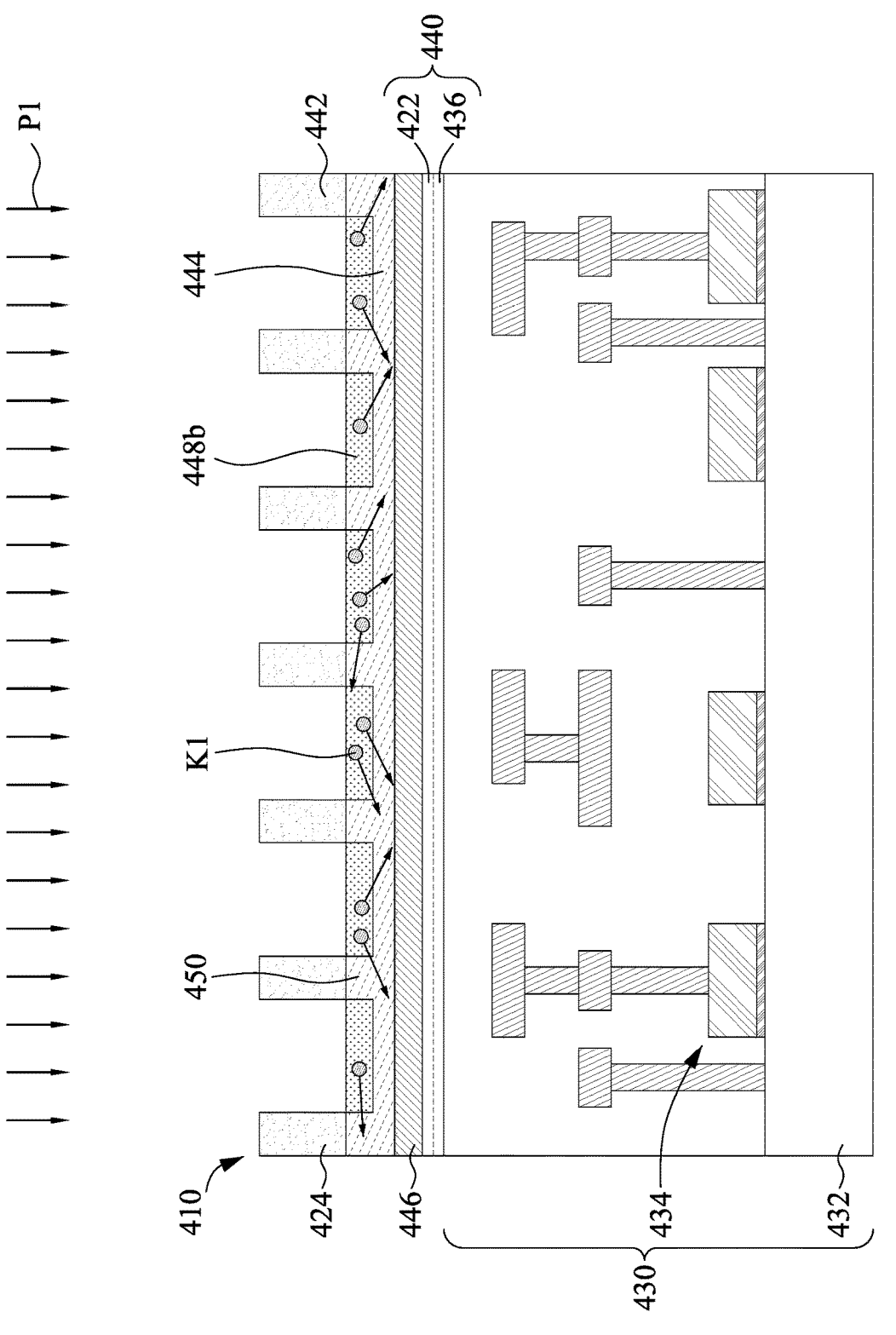
FIG. 15 illustrates one or more stages of an exemplary method for manufacturing a semiconductor device according to some embodiments of the present disclosure.

Referring to FIG. 15, an annealing technique P1 may be performed to diffuse dopants K1 in the dopant diffusion layer 448b into the semiconductor layer 442, thereby forming a doped region 450. The doped region 450 may have the first conductive type. In some embodiments, the dopants K1 may be diffused into the semiconductor connection structure 444. In some embodiments, the doped region 450 may have a relatively nonuniform dopant concentration than the doped region 424. In some embodiments, the doped region 450 has a greater dopant concentration in a region close to a lateral surface (not annotated) or close to an external surface of the semiconductor layer 442 and a smaller dopant concentration in a region far from the lateral surface or the external surface of the semiconductor layer 442. In some embodiments, the semiconductor connection structure 444 may have a smaller dopant concentration at a lower surface of the semiconductor connection structure 444 and a greater dopant concentration at an upper surface of the semiconductor connection structure 444.

13                                                                                           14

Figure 16:
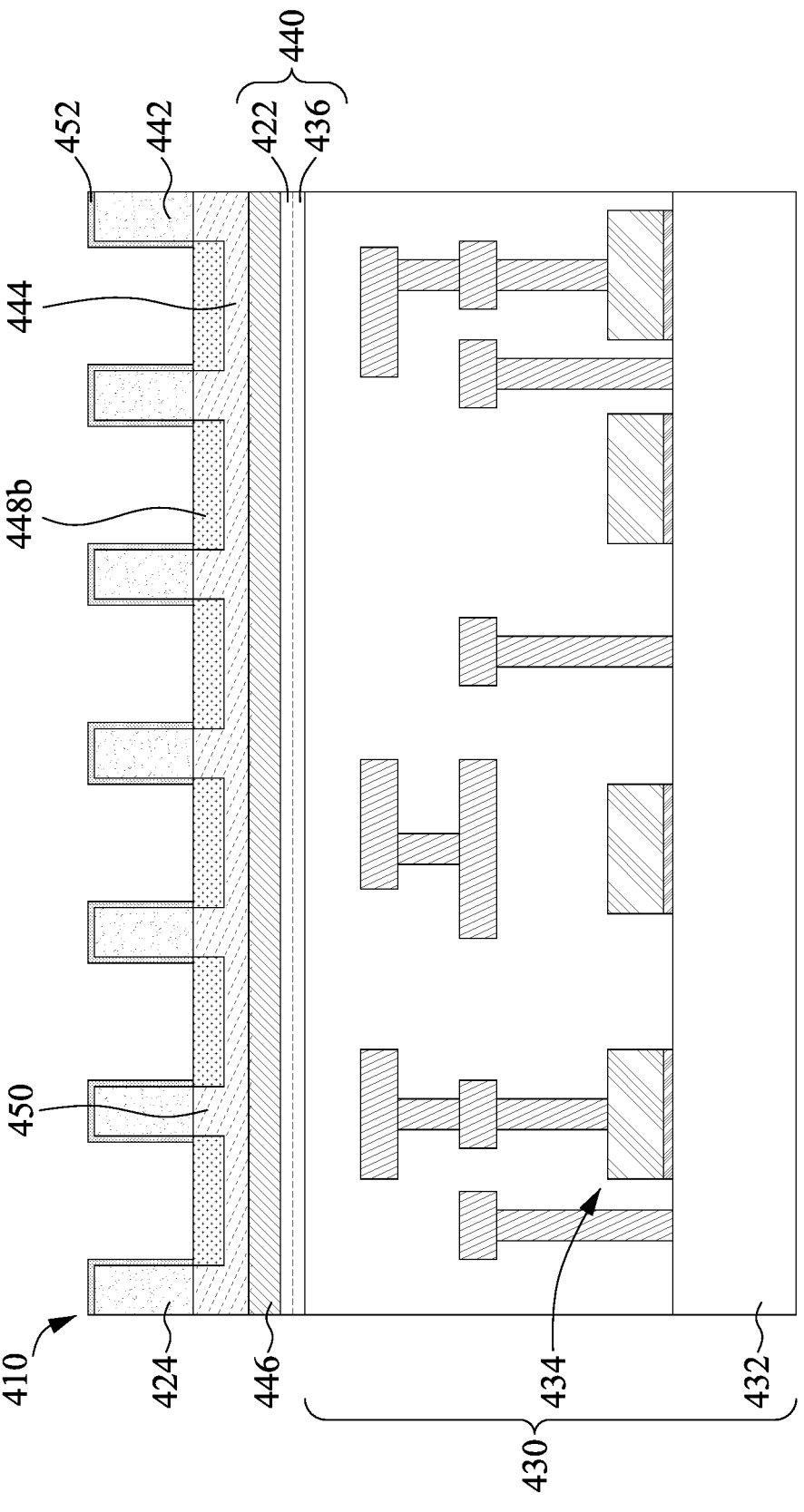
FIG. 16 illustrates one or more stages of an exemplary method for manufacturing a semiconductor device according to some embodiments of the present disclosure.

Referring to FIG. 16, a gate dielectric layer 452 may be formed to cover the upper surface and the lateral surface of the semiconductor layer 442. In some embodiments, the semiconductor layer 442 may be formed by, for example, a thermal oxidation.

Figure 17:
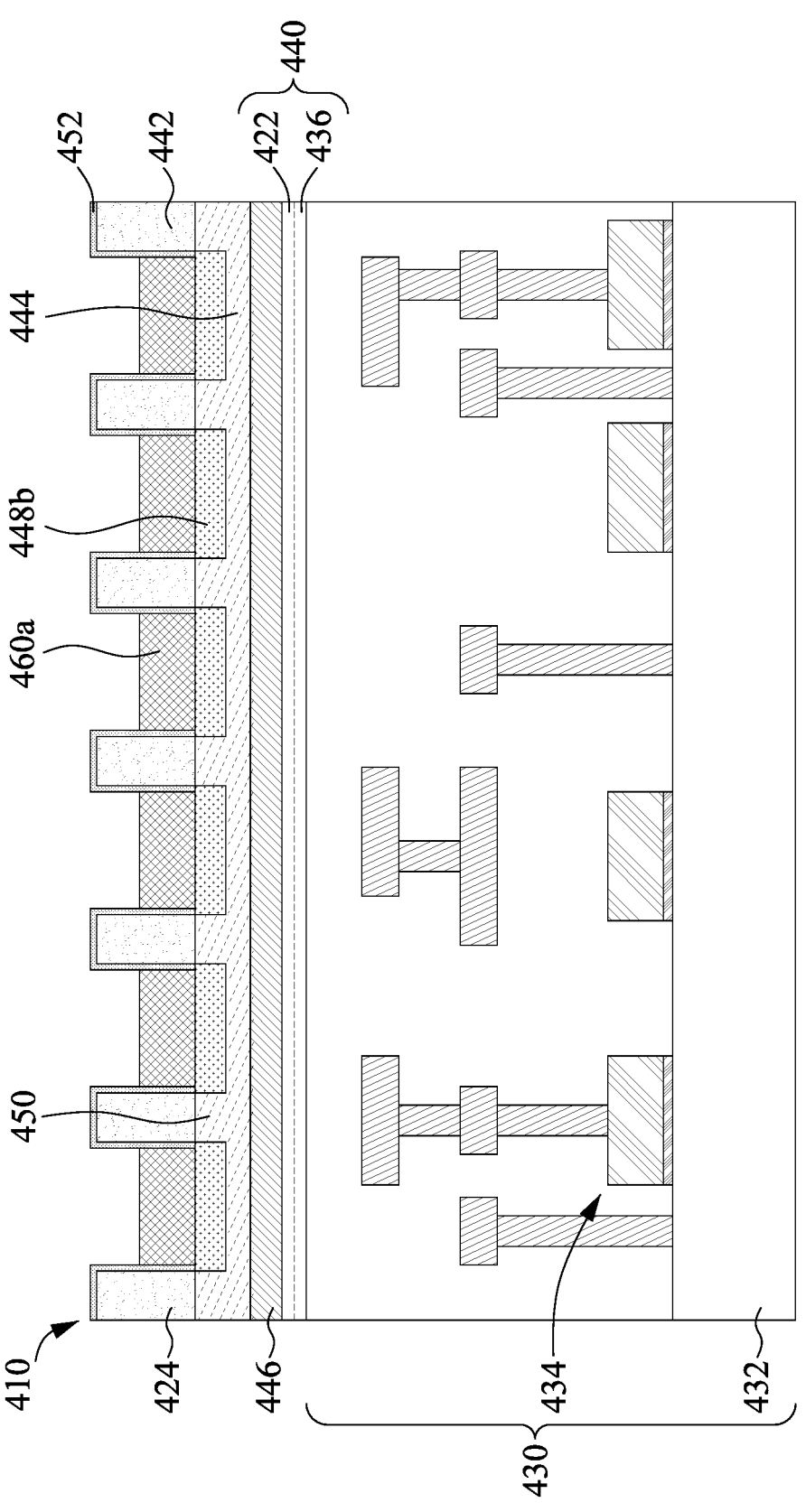
FIG. 17 illustrates one or more stages of an exemplary method for manufacturing a semiconductor device according to some embodiments of the present disclosure.

Referring to FIG. 17, a metallization layer 460a may be formed over the dopant diffusion layer 448b. In some embodiments, the metallization layer 460a may be spaced apart from the semiconductor layer 442 by the gate dielectric layer 452. In some embodiments, the metallization layer 460a may cover a portion of the lateral surface of the semiconductor layer 442. In some embodiments, a portion of the lateral surface of the semiconductor layer 442 may be exposed from the metallization layer 460a. The metallization layer 460a may be formed by, for example, PVD, CVD, ALD, LPCVD, or other suitable processes.

Figure 18:
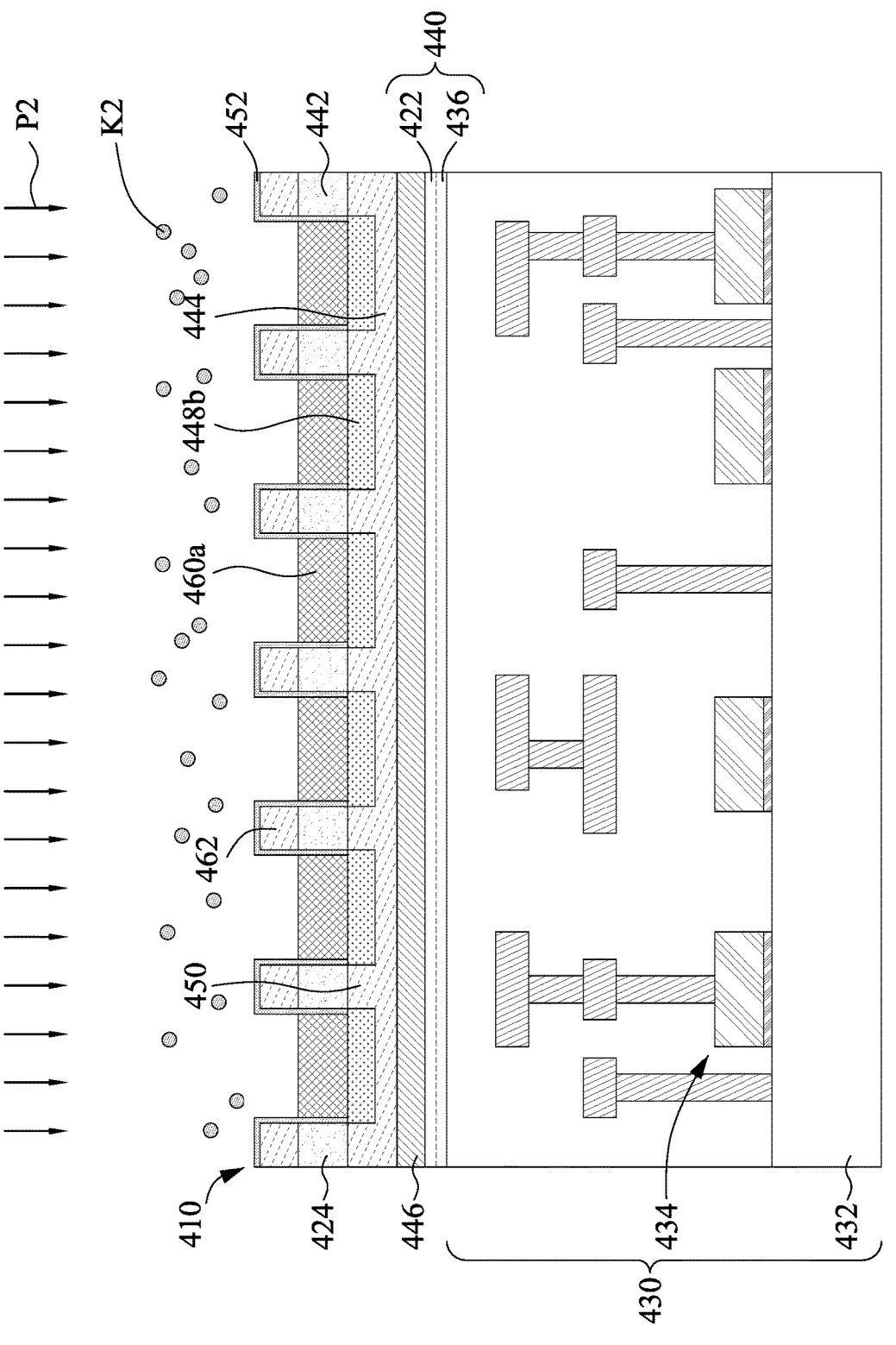
FIG. 18 illustrates one or more stages of an exemplary method for manufacturing a semiconductor device according to some embodiments of the present disclosure.

Referring to FIG. 18, an implantation technique P2, such as ion-implant technique may be performed to dope dopants K2 into the semiconductor layer 442, thereby forming a doped region 462. In some embodiments, the doped region 462 may have the first conductive type. In some embodiments, the dopant K1 may be different from the dopant K2. In some embodiments, the atomic number of the dopant K2 may be greater than that of the dopant K1. Since the doped region 450 is formed by a diffusion technique, the dopant K1 having a relatively small atomic number may be diffused into the semiconductor layer 442 easily than heavier one. Since the depth for forming the doped region 462 is relatively shallow, the dopant having a relatively great atomic number is preferred. For example, the dopant K1 may include phosphorus, and the dopant K2 may include arsenic. In this embodiment, the metallization layer 460a may serve as a mask to prevent the dopants K2 being doped into an undesired region. Therefore, a predetermined vertical length of the metallization layer 460a may be utilized to control the length of the doped region 424 or to control a distance between the doped region 450 and the doped region 462, which may serve as a channel of a transistor.

Figure 19:
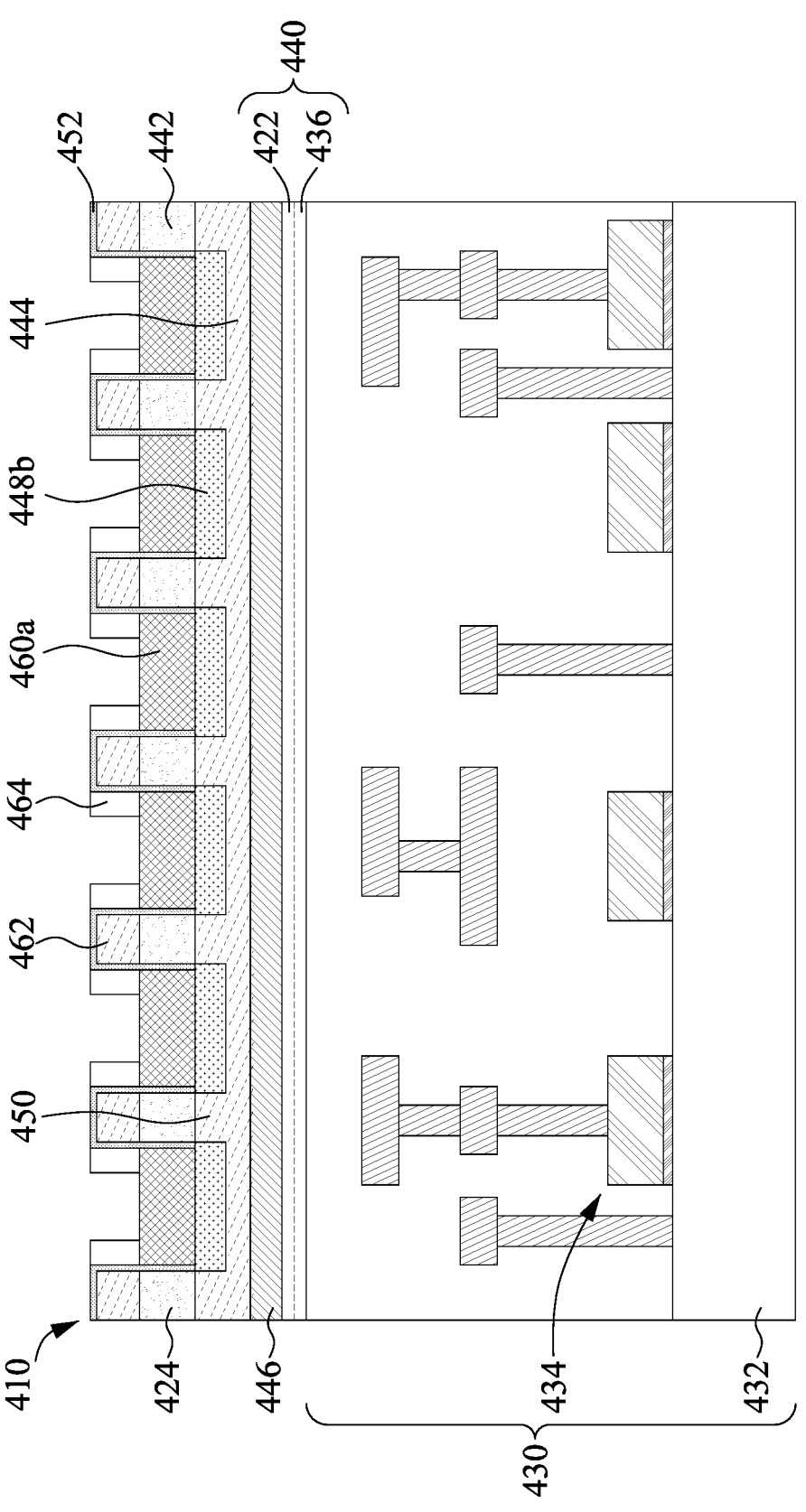
FIG. 19 illustrates one or more stages of an exemplary method for manufacturing a semiconductor device according to some embodiments of the present disclosure.

Referring to FIG. 19, a mask layer 464 may be formed over the metallization layer 460a. In some embodiments, the mask layer 464 may surround the semiconductor layer 442. In some embodiments, the mask layer 464 may cover the doped region 462 of the semiconductor layer 442. A portion of the metallization layer 460a may be exposed from the mask layer 464. The metallization layer 460a may be configured to define a profile of a word line. The mask layer 464 may include silicon oxide, silicon nitride, silicon oxynitride, or other suitable materials. The mask layer 464 may be formed by, for example, CVD, ALD, LPCVD, or other suitable processes.

Figure 20:
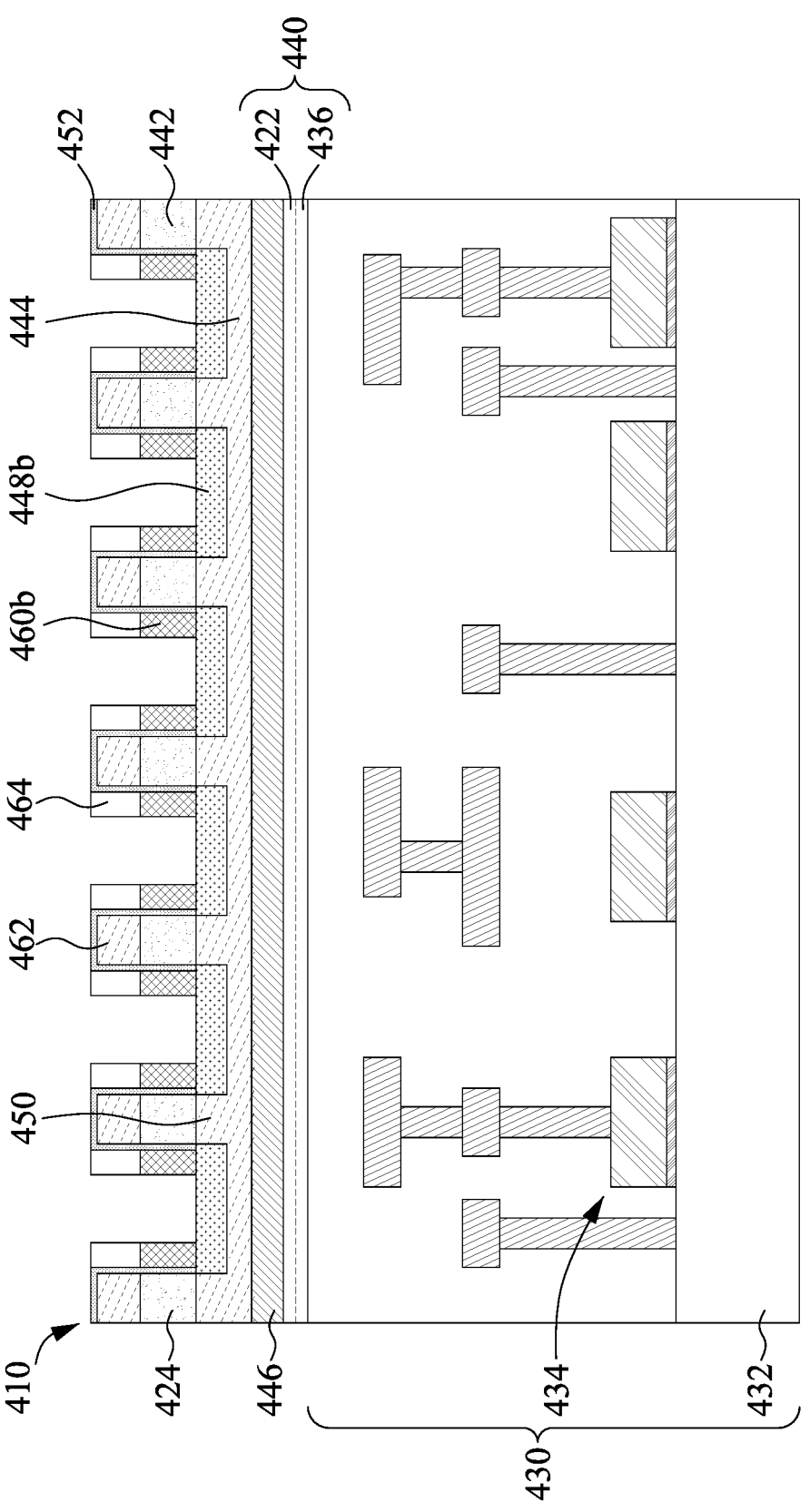
FIG. 20 illustrates one or more stages of an exemplary method for manufacturing a semiconductor device according to some embodiments of the present disclosure.

Referring to FIG. 20, the metallization layer 460a may be patterned to form a word line 460b. In some embodiments, the portion of the metallization layer 460a exposed from the mask layer 464 may be removed. In some embodiments, a portion of the dopant diffusion layer 448b may be exposed from the word line 460b. In some embodiments, an upper surface of the word line 460b may be substantially aligned with the boundary between the doped region 424 and the doped region 462.

Figure 21:
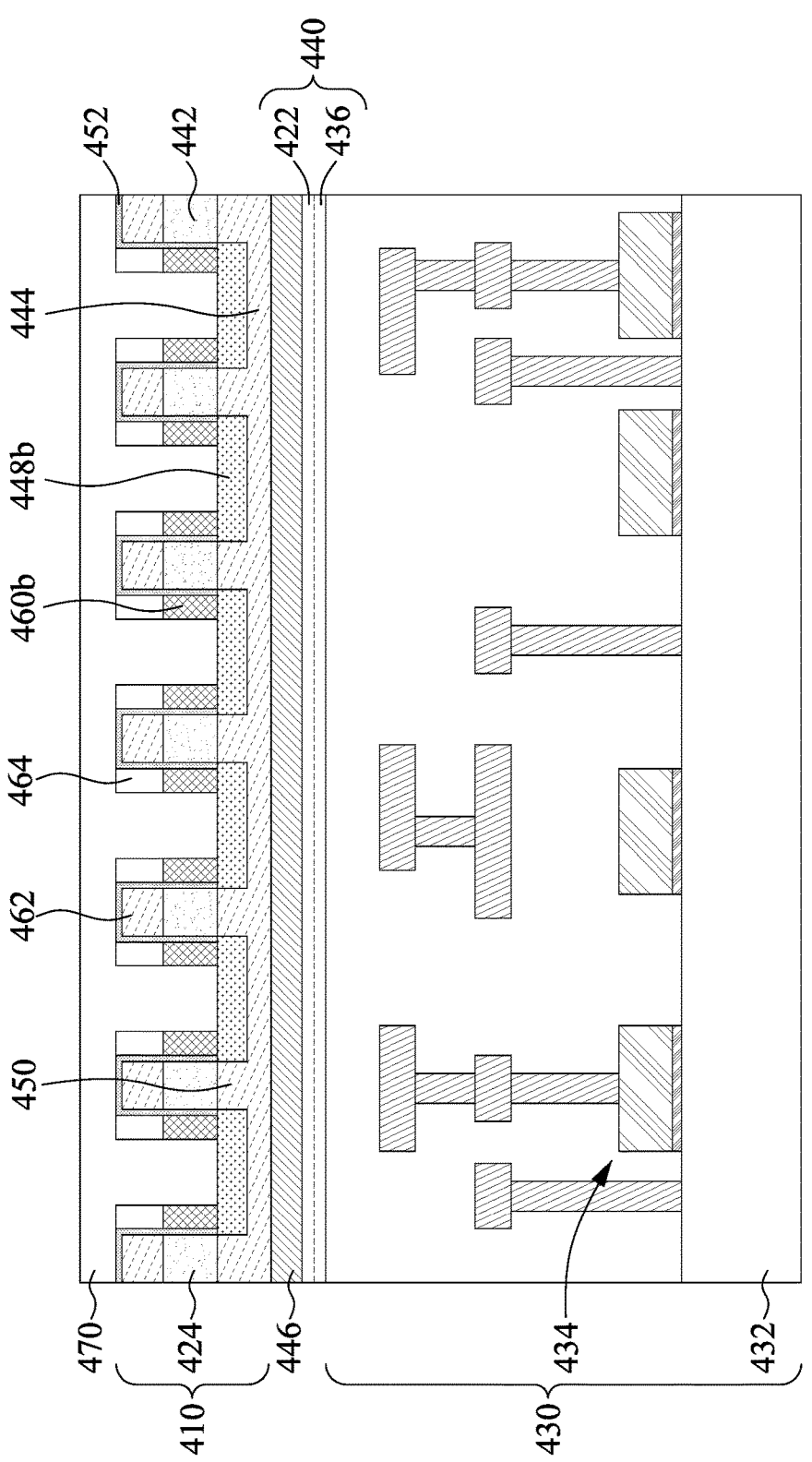
FIG. 21 illustrates one or more stages of an exemplary method for manufacturing a semiconductor device according to some embodiments of the present disclosure.

Referring to FIG. 21, a dielectric structure 470 may be formed to produce a semiconductor device 400. The dielectric structure 470 may include silicon oxide, silicon nitride, silicon oxynitride, or other suitable materials. The dielectric structure 470 may be formed by, for example, CVD, ALD, LPCVD, or other suitable processes.

In this embodiment, the semiconductor layer serving as the channel is formed in another wafer different from the wafer which logic circuits (e.g., 434) are formed within. The doped regions serving as source and drain (e.g., 450 and 462) are formed after two wafers are bonded. Further, the doped regions serving as source and drain are formed by different methods. As a result, the length of the channel may be determined by the word line. Further, the features in a respective wafer may be formed without considering thermal budget of the features formed the other wafer, facilitating the manufacturing processes. For example, the transistors 434 may be free from undergoing an annealing process for forming the doped region 424.

One aspect of the present disclosure provides a semiconductor device. The semiconductor device includes a substrate, a bit line, a semiconductor layer, and a word line. The bit line is disposed over the substrate. The semiconductor layer is disposed over the bit line. The word line abuts the semiconductor layer. The word line has a lower surface facing the substrate and an upper surface opposite to the lower surface. The semiconductor layer includes a first doped region with a first conductive type, a second doped region with a second conductive type opposite to the first conductive type. The first doped region is disposed between the second doped region and the bit line. The first boundary between the first doped region and the second doped region is substantially aligned with the lower surface of the word line.

Another aspect of the present disclosure provides a semiconductor device. The semiconductor device includes a substrate, a bit line, a plurality of semiconductor layers, a plurality of word lines, and a semiconductor connection structure. The bit line is disposed over the substrate. The semiconductor layer is disposed over the bit line. Each of the word line surrounds a respective one of the plurality of semiconductor layers. The semiconductor connection structure connects the plurality of semiconductor layers.

Another aspect of the present disclosure provides a method for manufacturing a semiconductor device. The method includes providing a first substrate. The method also includes forming a bit line over the first substrate. The method further includes forming a semiconductor layer over the first substrate. The semiconductor layer comprises a first conductive type. In addition, the method includes forming a first doped region in the semiconductor layer. The first doped region has a second conductive type different from the first conductive type. The first doped region abuts the bit line. The method also includes forming a second doped region in the semiconductor layer. The second doped region has the second conductive type. The first doped region is spaced apart from the second doped region. The method further includes forming a word line abutting the semiconductor layer.

The embodiments of the present disclosure provide a semiconductor device and method of manufacturing the same. The semiconductor device may include a semiconductor layer with doped regions serving as source, drain, and/or channel. In this embodiment, the length of the channel may be determined by a vertical length of a word line, which may be precisely controlled. Further, the semiconductor layer and some of the doped regions therein may be formed in one wafer, which will be bonded to another wafer containing gate structures or other elements sensitive to thermal budget. In this condition, the features in a respective wafer may be formed without considering thermal budget of the features formed the other wafer.

Although the present disclosure and its advantages have been described in detail, it should be understood that various changes, substitutions and alterations may be made herein without departing from the spirit and scope of the disclosure as defined by the appended claims. For example, many of the processes discussed above may be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or steps.

What is claimed is:

1. A semiconductor device, comprising:
a substrate;
a bit line disposed over the substrate;
a semiconductor layer disposed over the bit line,
a word line surrounding a portion of the semiconductor layer, wherein the word line has a lower surface facing the substrate and an upper surface opposite to the lower surface, wherein the semiconductor layer comprises a first doped region with a first conductive type, a second doped region with a second conductive type opposite to the first conductive type, and a third doped region, wherein the first doped region is disposed between the second doped region and the bit line, and a first boundary between the first doped region and the second doped region is horizontally aligned with the lower surface of the word line;
wherein a dopant in the first doped region is different from a dopant in the third doped region;
wherein a second boundary between the second doped region and the third doped region is horizontally aligned with the upper surface of the word line.

2. The semiconductor device of claim 1, wherein the third doped region has the first conductive type, and the second doped region is disposed between the first doped region and the third doped region.

3. The semiconductor device of claim 2, wherein a first vertical length of the word line is equal to a second vertical length of the second doped region of the semiconductor layer.

4. The semiconductor device of claim 2, further comprising:
a bonding structure disposed between the substrate and the bit line, wherein the bonding structure comprises a dielectric material.

* * * * *